United States Patent [19]
Nakao

[11] Patent Number: 5,744,268
[45] Date of Patent: Apr. 28, 1998

[54] PHASE SHIFT MASK, METHOD OF MANUFACTURING A PHASE SHIFT MASK AND METHOD OF FORMING A PATTERN WITH PHASE SHIFT MASK

[75] Inventor: Shuji Nakao, Hyogo, Japan

[73] Assignee: Mitsubishi Denki Kabushiki Kaisha, Tokyo, Japan

[21] Appl. No.: 780,266

[22] Filed: Jan. 8, 1997

[30] Foreign Application Priority Data

Sep. 6, 1996 [JP] Japan .................................. 8-236466

[51] Int. Cl.$^6$ .................................................. G03F 9/00
[52] U.S. Cl. .................................................. 430/5; 430/322
[58] Field of Search ............................... 430/5, 322, 324, 430/22

[56] References Cited

U.S. PATENT DOCUMENTS 5,608,775  3/1997  Watanabe ........................................ 430/5
5,670,281  9/1997  Dai .................................................. 430/5

FOREIGN PATENT DOCUMENTS 4-186244  7/1992  Japan .
5-265181  10/1993  Japan .
7-92655   4/1995  Japan .
7-261367  10/1995  Japan .

Primary Examiner—S. Rosasco
Attorney, Agent, or Firm—Lowe, Price, LeBlanc & Becker

[57] ABSTRACT

A surface of a transparent substrate is exposed at a first light transmission region $Ta_1$, a semi-shield film is formed on the surface of the transparent substrate at a second light transmission region $Ta_2$, a trench is formed at the surface of the transparent substrate at a third light transmission region $Tn_1$, the semi-shield film and a phase shifter layer are layered on the surface of the transparent substrate at a fourth light transmission region $Tn_2$, and the semi-shield film, the phase shifter layer and a shield film are layered on the surface of the transparent substrate at a shield region S. Thereby, hole patterns at a fine pitch can be precisely formed at a photoresist of a positive type by an exposure apparatus using a reduced number of a mask and having a simple structure.

7 Claims, 21 Drawing Sheets

SECTION A-A

SECTION B-B

LINE C—C

INTENSITY ON WAFER

SL

LINE D—D

INTENSITY ON WAFER

SL

LINE E—E

INTENSITY ON WAFER

SL

FIELD ON MASK

INTENSITY ON WAFER

FIELD ON MASK

INTENSITY ON WAFER

FIELD ON MASK

INTENSITY ON WAFER

LINE C1–C1

INTENSITY ON WAFER

LINE D1–D1

INTENSITY ON WAFER

LINE E1–E1

INTENSITY ON WAFER

PHASE SHIFT MASK, METHOD OF MANUFACTURING A PHASE SHIFT MASK AND METHOD OF FORMING A PATTERN WITH PHASE SHIFT MASK

BACKGROUND OF THE INVENTION

1. Field of the Invention

The present invention relates to a phase shift mask, a method of manufacturing a phase shift mask and a method of forming a pattern with a phase shift mask.

2. Description of the Background Art

Semiconductor integrated circuits have recently been remarkably integrated and miniaturized. In accordance with this, circuit patterns formed on semiconductor substrates (which will be referred to as wafers hereinafter) have been rapidly miniaturized.

In particular, a photolithography technique has been widely recognized as a basic technique for pattern formation. Accordingly, the photolithography has been developed and improved in various manners. Patterns have been and will be miniaturized, and demand for improvement in resolution of patterns has been and will be increased.

The photolithography technique is a technique for transferring a pattern having a mask (original image) form to photoresist applied to a wafer, and patterning an etching film (i.e., film to be etched) at a lower layer using the photoresist bearing the transferred pattern. In the process of transferring this photoresist, development is effected on the photoresist. When the photoresist is of a positive type, a portion of the photoresist exposed to light is removed. When the photoresist is of a negative type, a portion of the photoresist shaded from light is removed.

In general, a resolution limit R (nm) in the photolithography using a reduction exposure system is expressed by the following formula:

$$R = k_1 \cdot \lambda / (NA)$$

where $\lambda$ represents a wavelength (nm) of light used for exposure, NA represents a numerical aperture, and $k_1$ is a constant depending on the resist process.

As can be understood from the above formula, the resolution limit R may be improved, and thereby the pattern may be further miniaturized by reducing the values of $k_1$ and $\lambda$ and increasing the value of NA. Thus, the above improvement can be achieved by reducing the constant depending on the resist process, and by reducing the wavelength and increasing NA.

However, further improvement of light sources and lenses is difficult. Also, reduction in wavelength and increase in NA reduce a depth of focus $\delta$ ($\delta = k_2 \cdot \lambda / (NA)^2$), and thus conversely result in further reduction in resolution.

Accordingly, it has been studied to miniaturize patterns by improving photomasks instead of light sources and lenses. Attention has recently been given to a phase shift mask as a photomask for improving a resolution of a pattern. A structure and a principle of the phase shift mask will now be described below in comparison with an ordinary photomask. In the following description of phase shift masks, a Levenson type and a halftone type will be discussed.

FIGS. 23A, 23B and 23C relate to an ordinary photomask, and in particular show a section of a mask, an electric field on the mask and a light intensity on a wafer, respectively. Referring to FIG. 23A, the ordinary photomask has a glass substrate 101 and a metal mask pattern 103 formed thereon.

In this ordinary photomask, the electric field which is spacially pulse-modulated by metal mask pattern 103 appears on the mask, as shown in FIG. 23B.

Referring to FIG. 23C, miniaturization of pattern may cause such a situation that exposure light transmitted through the photomask deflects toward an non-exposure region (i.e., region which is shaded from exposure light with metal mask pattern 103) due to a diffraction effect of light. Therefore, even a non-exposure region on the wafer is irradiated with light, which reduces a contrast of light (difference in light intensity between the exposure region and the non-exposure region on the wafer). As a result, the resolution decreases, and transfer of fine patterns becomes difficult.

FIGS. 24A, 24B and 24C relate to a phase shift mask of a Levenson type, and in particular show a section of a mask, an electric field on the mask and a light intensity on the wafer, respectively. Referring to FIG. 24A, the phase shift mask includes optical members 105 called a phase shifter in addition to components of an ordinary photomask.

More specifically, metal mask pattern 103 is formed on glass substrate 101 to provide exposure regions and nonexposure regions. The phase shifter 105 is arranged at every other exposure region. Each phase shifter 105 serves to convert the phase of transmitted light by 180 degrees.

Referring to FIG. 24B, the electric field on the mask produced by the light transmitted through the phase shift mask has phases which are alternately inverted by 180 degrees owing to provision of the phase shifter 105 at every other exposure region. Since phases of light at adjacent exposure regions are opposite to each other, the light cancel each other at a portion where light of opposite phases overlap with each other owing to an interference effect of light.

As a result, as shown in FIG. 24C, the light intensity decreases at a boundary between the exposure regions, and a sufficiently large difference in light intensity can be ensured between the exposure region and the non-exposure region on the wafer. Thereby, resolution can be improved, and transfer of fine patterns is allowed.

FIGS. 25A, 25B and 25C relate to a phase shift mask of a halftone type, and in particular show a section of a mask, an electric field on the mask and a light intensity on the wafer, respectively. Referring to FIG. 25A, the phase shift mask of the halftone type includes an optical member 106 called a phase shifter, similarly to the Levenson type described above.

However, the optical member 106 is formed only on semi-shield film 103 on glass substrate and thereby forms a two-layer structure together with semi-shield film 103. Phase shifter 106 serves to change the phase of transmitted light by 180 degrees, similarly to the foregoing case, and translucent or semi-shield film 103 does not completely interrupt the exposure light but serves to damp the intensity of exposure light.

Referring to FIG. 25B, since the phase shift mask has the two-layer structure including phase shifter 106 and translucent film 103, the electric field on the mask has phases which are alternately converted by 180 degrees, and one of adjacent two phases has a smaller intensity than the other. Thus, transmission through phase shifter 106 converts the phase by 180 degrees, and transmission through translucent film 103 damps the light intensity to leave a predetermined thickness of photoresist after development. The light phases at adjacent exposure regions are opposite to each other, so that the light cancel each other at a portion where light of opposite phases overlap each other.

As a result, as shown in FIG. 25C, the phase is inverted at the edge of the exposure pattern, and the light intensity is reduced at the edge of the exposure pattern. Consequently, a large difference in light intensity occurs between the exposure light transmitted through translucent film 103 and the exposure light not transmitted through the same, so that the resolution of the pattern image can be improved.

Generally, swelling of polymer occurs at a photoresist of a negative type during development. Therefore, a photoresist of a positive type is generally used for a pattern requiring a high resolution, which can be attained by a phase shift mask. Japanese Patent Laying-Open No. 8-184876 filed on Jul. 15, 1996, titled "Exposing Apparatus With a Phase Shift Mask And Method of Forming a Pattern" and invented by the same inventors has proposed a method of forming a fine hole pattern for a photoresist of a positive type. This technique will be described below as a prior art.

FIG. 26 is a schematic diagram showing a structure of an exposure apparatus using conventional phase shift masks. FIGS. 27 and 28 are plans schematically showing structures of two phase shift masks used for exposure, and FIG. 29 is a schematic cross section taken along line F—F in FIG. 27.

Referring to FIG. 26, exposure with the conventional phase shift masks is interference exposure. More specifically, exposure light transmitted through one of two phase shift masks 210A and 210B interfere with exposure light transmitted through the other, so that the photoresist is exposed by the interfered composite light.

More specifically, exposure light 260 emitted from a light source 252 are gathered by a condenser lens 254. On this gathering way, the exposure light 260 are split into two directions by a beam splitter 258. Thus, the half amount of exposure light 260A are reflected by beam splitter 258 by an angle of 90 degrees with respect to an incident direction, and the remaining half amount of exposure light 260B travel through beam splitter 258.

Reflected exposure light 260A travel through first phase shift mask 210A, are reflected by a reflection mirror 262A and travel through a first compensator 264A.

The other exposure light 260B travel through second phase shift mask 210B, are reflected by a reflection mirror 262B and travel through a second compensator 264B.

Exposure light 260A transmitted through first compensator 264A and exposure light 260B transmitted through second compensator 264B are interfered and overlaid with each other by a beam splitter 266. Thus, beam splitter 266 allows exposure light 260A to travel therethrough, and also reflects other exposure light 260B by 90 degrees with respect to the incident direction.

The exposure light 260C thus interfered and overlaid travel through a projection optical system 268 formed of a reducing lens and others, and are irradiated to photoresist applied onto a wafer 284.

First phase shift mask 210A used for interference exposure is of a Levenson type having first and second light transmission regions Ta and Tn and shield regions S as shown in FIGS. 27 and 29, and has a transparent substrate 201 and shield films 203.

At second light transmission regions Tn, transparent substrate 201 is provided at its surface with trenches 201a. Owing to this structure, first and second light transmission regions Ta and Tn allow transmission of exposure light with different phases shifted by 180 degrees from each other. Shield region S covered with shield film 3 is arranged at each region between first and second light transmission regions Ta and Tn. A plane pattern of each of first and second light transmission regions Ta and Tn and shield region S has a linear form extending substantially straight in a direction Y in the figure.

Second phase shift mask 210B has the substantially same structure as first phase shift mask 210A described above, as shown in FIG. 28. However, first and second light transmission regions Ta and Tn and shield region S in second phase shift mask 210B have linear forms extending substantially straight in a direction X in the figure. Therefore, a section of second shift mask 210B taken along line G—G corresponds to a section shown in FIG. 29.

When interference exposure is performed with first and second phase shift masks 210A and 210B, the light intensity on photoresist is distributed as will now be described below.

FIG. 30A is a schematic plan showing a state of overlapping of first and second phase shift masks in an interference exposure processing. FIGS. 30B, 30C and 30D show light intensities on the wafer along lines $C_1$—$C_1$, $D_1$—$D_1$ and $E_1$—$E_1$ in FIG. 30A.

Referring first to FIG. 30A, images of first and second phase shift masks 210A and 210B are simultaneously exposed on the photoresist as described before. In this process, the interference exposure is performed such that the pattern of first phase shift mask 210A extending straight is substantially perpendicular to the pattern of the second phase shift mask 210B extending straight.

First light transmission regions Ta of first phase shift mask 210A have region portions overlapping with region portions of first light transmission regions Ta of second phase shift mask 210B, and exposure light transmitted through these overlapped region portions have the same phase. Therefore, these exposure light enhance each other, so that the exposure light transmitted through these region portions have the maximum intensity. Likewise, second light transmission regions Tn have overlapped region portions, at which the exposure light enhance each other and have the maximum intensity.

At overlapped region portions of shield regions S and first light transmission regions Ta (or second light transmission regions Tn), the exposure light have the substantially same intensity as the exposure light transmitted only through first light transmission region Ta (or second light transmission region Tn). Therefore, the exposure light transmitted through the overlapped portions of first light transmission regions Ta (or second light transmission regions Tn) have a light intensity lower than those transmitted through the overlapped regions of first light transmission regions Ta (or second light transmission regions Tn) at two phase shift masks 210A and 210B.

First light transmitting potions Ta also have portions which overlap with second light transmission regions Tn. Exposure light transmitted through the overlapped portions of first light transmission region Ta have a phase opposite to that of the exposure light transmitted through the overlapped portions of second light transmission regions Tn. Therefore, these two kinds of exposure light cancel with each other, and the exposure light at these overlapped region portions have the intensity of substantially 0.

Referring to FIGS. 30A and 30B, the intensity of exposure light along line $C_1$—$C_1$ takes on the maximum value at the overlapped region portions of first light transmission regions Ta of both the masks. At the overlapped region portions of first light transmission region Ta and shield regions S, the intensity of exposure light is lower than that at the overlapped region portions of first light transmission regions Ta of both the masks. At the overlapped region portions of first light transmission region Ta and second light transmission region Tn, the exposure light have the intensity of substantially 0.

Referring to FIGS. 30A and 30C, the intensity of exposure light along line $D_1$—$D_1$ takes on the largest value at the overlapped region portions of second light transmission regions of both masks 210A and 210B. At the overlapped region portions of second light transmission regions Tn and shield region S, the intensity of exposure light is lower than that at the overlapped region portions of second light transmission regions Tn of both the masks. At the overlapped regions of first and second light transmission regions Ta and Tn, the intensity of exposure light is substantially 0.

Referring to FIGS. 30A and 30D, the light intensity of exposure light along line $E_1$—$E_1$ takes on a relatively large value at the overlapped region portions of first light transmission regions Ta (or second light transmission regions Tn) and shield regions S. At the overlapped region portions of shield regions S of both masks 210A and 210B, the intensity of exposure light is substantially 0.

By the exposure and development of the photoresist of the positive type having an intensity distribution of the exposure light, photoresist portions exposed to exposure light having an intensity of a slice level SL or more are removed to form hole patterns.

The above slice level SL indicates the reference of light intensity for determining whether the resist is to be removed (or left) or not.

By the interference exposure with two phase shift masks described above, hole patterns at a fine pitch can be precisely formed at the photoresist of the positive type.

However, this method requires interference of exposure light transmitted through two phase shift masks, so that at least two phase shift masks are disadvantageously required.

Further, images of the two phase shift masks must be transferred onto the photoresist for exposure, the exposure apparatus must have a complicated structure.

SUMMARY OF THE INVENTION

Accordingly, an object of the invention is to provide a phase shift mask, which can reduce the number of required masks, can be applied to an exposure apparatus of a simple structure and can precisely form hole patterns at a fine pitch on a photoresist of a positive type, as well as a method of manufacturing such a phase shift mask and a method of forming a pattern with such a phase shift mask.

A phase shift mask of the invention includes a substrate, a semi-shield film, a phase shift film and a shield film. The substrate has first, second, third and fourth light transmission regions allowing transmission of exposure light therethrough, also has a shield region interrupting exposure light, and is provided at a main surface of the third light transmission region with a trench for transmitting the exposure light therethrough such that the third light transmission region transmits the exposure light of a phase different from that of the exposure light transmitted through the first and second light transmission regions. The semi-shield film is formed on the main surface of the substrate for damping the intensity of the exposure light, covers the second and fourth light transmission regions, and exposes the first and third light transmission regions. The phase shift film is formed on the main surface of the substrate, covers the fourth light transmission region and exposes the first, second and third light transmission regions for setting a phase of the exposure light transmitted through the fourth light transmission region to be different from that of the exposure light transmitted through the first and second light transmission regions and to be substantially equal that of the exposure light transmitted through the third light transmission region. The shield film is formed on the main surface of the substrate, covers the shield region and exposes the first, second, third and fourth light transmission regions.

The phase shift mask of the invention includes the first to fourth light transmission regions for the transmitted light of different phases or different intensities. By appropriately arranging the first to fourth light transmission regions, the intensity of exposure light can be distributed similarly to the prior art. Therefore, hole patterns at a fine pitch can be precisely formed at a photoresist of a positive type with one phase shift mask.

Since it is required to expose the photoresist with an image of only one phase shift mask, a complicated structure of the exposure apparatus is not required in contrast to the prior art. Accordingly, an exposure apparatus can have a simple structure, and can precisely form hole patterns at a fine pitch on the photoresist of the positive type.

Preferably, in the above aspect, the semi-shield film and the phase shift film are formed on the main surface of the substrate at the shield region.

Preferably, in the above aspect, the main surface of the substrate has first and second plane regions each having a substantially square planar shape. Four shield regions spaced from each other are formed at four corners of the first plane region. The second light transmission region is arranged at each of areas extending along the four sides defining the planar shape of the first plane region, respectively, and located between the shield regions. The first light transmission region is arranged at a substantially central portion of the first plane region and is in contact with each of the second light transmission regions arranged within the first plane region. Four shield regions spaced from each other are arranged at four corners of the second plane region. The fourth light transmission region is arranged at each of areas extending along the four sides defining the planar shape of the second plane region, respectively, and located between the shield regions. The third light transmission region is arranged at a substantially central portion of the second plane region and is in contact with each of the fourth light transmission regions arranged within the second plane region.

Preferably, in the above aspect, one of the shield regions in the first plane region and one of the shield regions in the second plane region are commonly used by the first and second plane regions.

Preferably, in the above aspect, the mask further includes a third plane region on the main surface of the substrate, the first and third light transmission regions in the third plane region extending parallel to each other in a predetermined direction with the shield region therebetween.

This arrangement of the first and third light transmission regions allows formation of not only hole patterns but also patterns of line/space. Therefore, the mask can be applied to patterns of various forms compared with a phase shift mask of a mere halftone type.

A method of manufacturing a phase shift mask according to the invention includes the following steps.

A semi-shield film for damping an intensity of exposure light, a phase shift film for changing a phase of the exposure light and a shield film for interrupting the exposure light are successively formed on a main surface of a substrate having first, second, third and fourth light transmission regions and a shield region. The shield film and the phase shift film are successively removed from the first, second and third light transmission regions to expose the surface of the semi-shield film. The semi-shield film is removed from the first and third light transmission regions to expose the main surface of the substrate. A trench is formed at the main surface of the substrate at the third light transmission region. The semi-shield film is removed from the first light transmission region to expose the main surface of the substrate. The shield film is removed from the fourth light transmission region to expose the surface of the phase shift film.

In the method of manufacturing the phase shift mask according to the invention, the trench is formed at the substrate by effecting etching on the substrate masked with the patterned semi-shield film or the like. Thus, a shift pattern at a background is formed after patterning the semi-shield film or the like. Therefore, it is not necessary to deposit and pattern the semi-shield film after forming the shift pattern at the background. Accordingly, precise alignment for the shift pattern at the background is not required in the process of patterning the semi-shield film.

Blanks are formed by successively forming the semi-shield film, the phase shift film and the shield film on the main surface of the substrate. After the blanks are formed in this manner, it is not necessary to from a film other than the photoresist. Therefore, it is possible to prevent generation of a defect in the film, which may be caused by deposition after patterning the film of the blanks or substrate. Accordingly, the phase shift mask with fewer defects can be produced.

A method of forming a pattern with a phase shift mask according to the invention is executed by effecting exposure on a predetermined region of photoresist applied to a wafer with a phase shift mask. The phase shift mask used in this pattern forming method includes a substrate, a semi-shield film, a phase shift mask and a shield film. The substrate has first, second, third and fourth light transmission regions allowing transmission of exposure light therethrough as well as a shield region interrupting the exposure light, and is provided at its main surface in the third light transmission region with a trench for transmitting the exposure light therethrough such that the third light transmission region transmits the exposure light of a phase different from that of the exposure light transmitted through the first and second light transmission regions. The semi-shield film is formed on the main surface of the substrate to cover the second and fourth light transmission regions and expose the first and third light transmission regions for damping the intensity of the exposure light. The phase shift film is formed on the main surface of the substrate to cover the fourth light transmission region and expose the first, second and third light transmission regions for setting the phase of the exposure light transmitted through the fourth light transmission region to be different from the phase of the exposure light transmitted through the first and second light transmission region and to be substantially equal to that of the exposure light transmitted through the third light transmission region. The shield light film is formed on the main surface of the substrate to cover the shield region and expose the first, second and third light transmission regions. The photoresist is of a positive type, and hole patterns are formed at a region on the surface of the photoresist irradiated with the exposure light through the first and third light transmission regions at the phase shift mask by development of the photoresist.

According to the method of forming the pattern using the phase shift mask of the invention, the hole patterns at a fine pitch can be precisely formed at the photoresist of the positive type by an exposure apparatus of a simple structure using the single mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described below with reference to the drawings.

Figure 1:
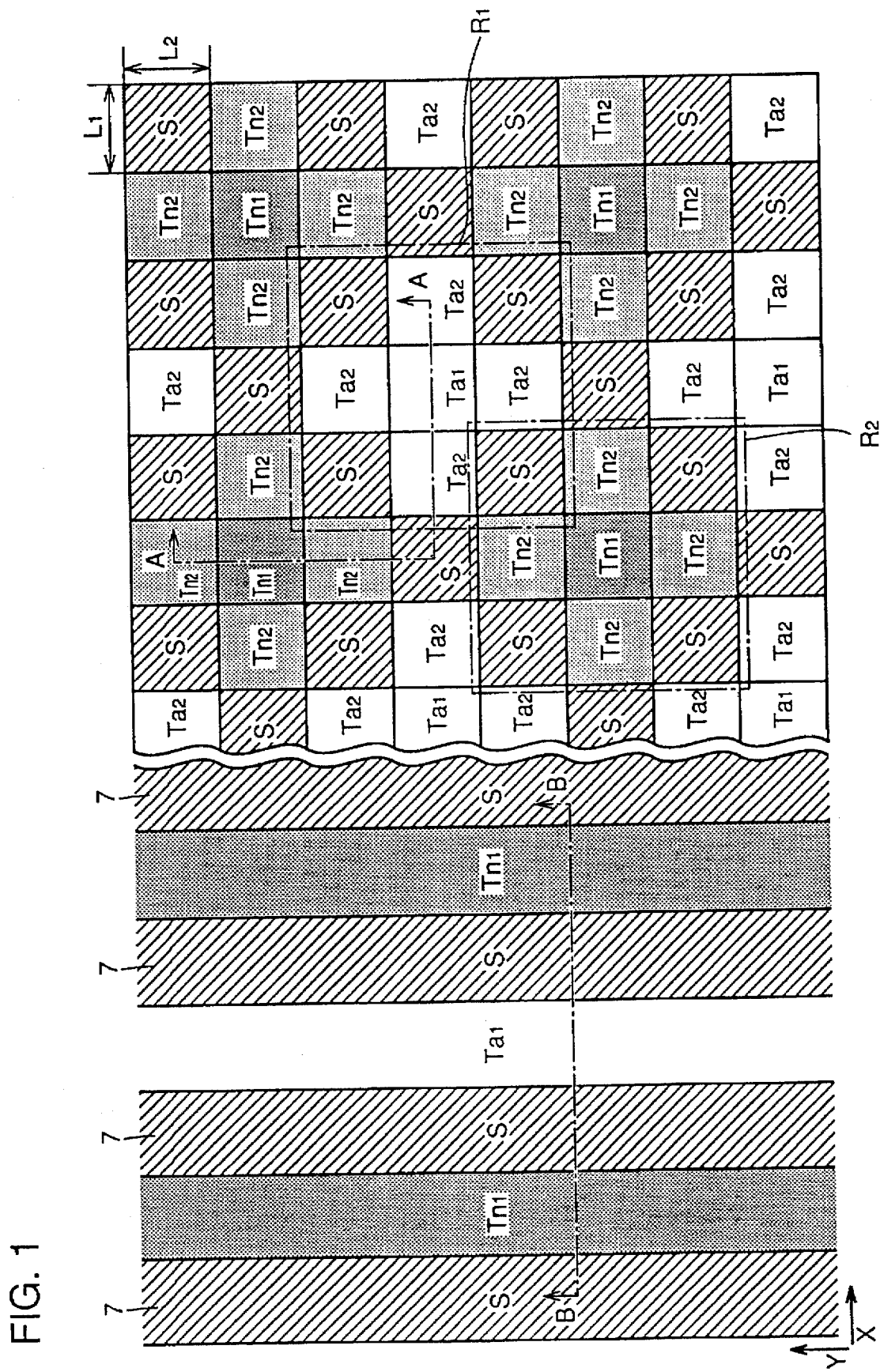
FIG. 1 is a plan schematically showing a structure of a phase shift mask of an embodiment of the invention.
Figure 2:
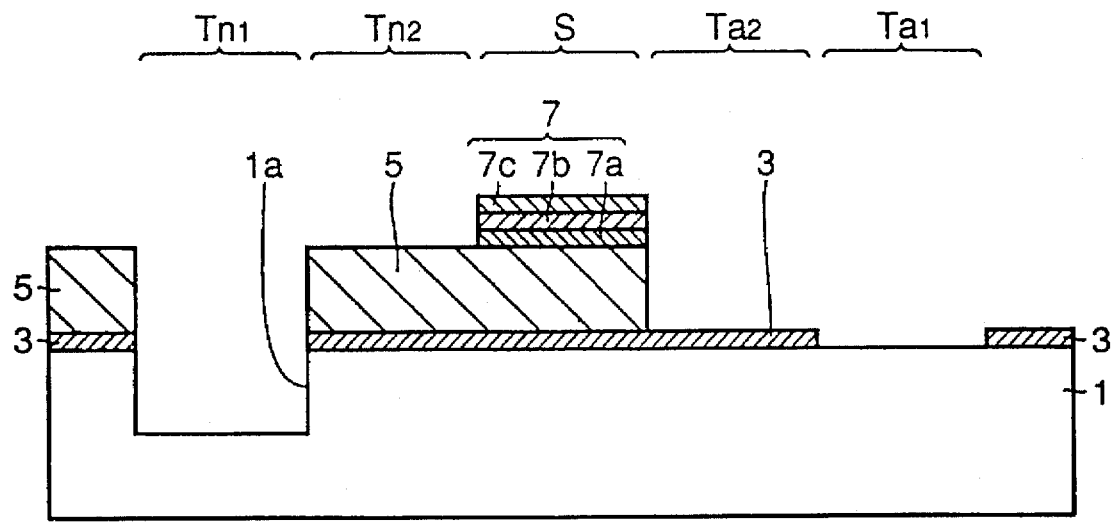
FIG. 2 is a schematic cross section taken along line A—A in FIG. 1.
Figure 3:
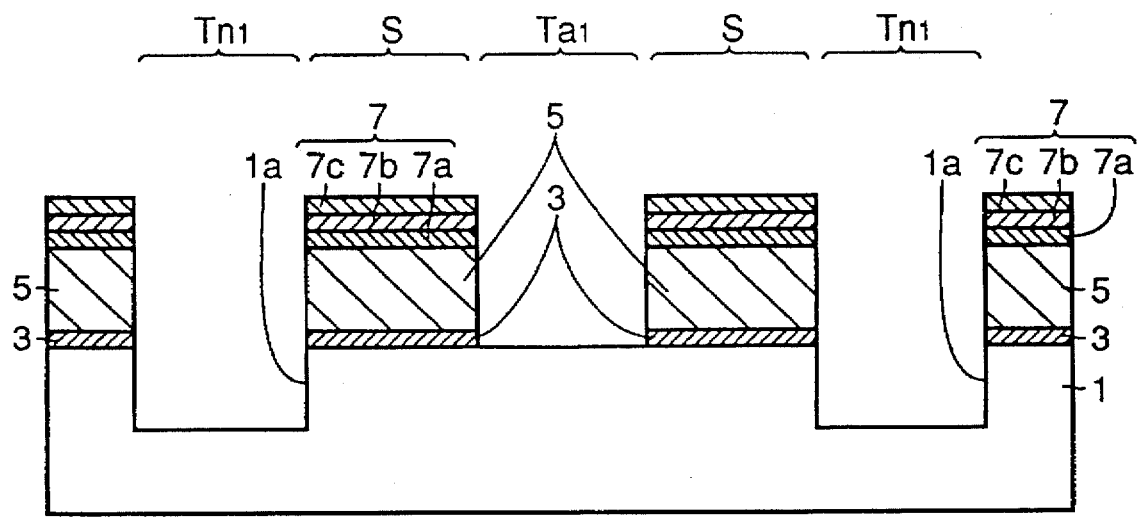
FIG. 3 is a schematic cross section taken along line B—B in FIG. 1.

Referring to FIGS. 1 to 3, a phase shift mask of an embodiment includes a hole pattern formation region (FIG. 2) and a line/space pattern formation region (FIG. 3).

In the hole pattern formation region, there are arranged first, second, third and fourth light transmission regions $Ta_1$, $Ta_2$, $Tn_1$ and $Tn_2$ as well as a shield region S. In first light transmission region $Ta_1$, the surface of a transparent substrate 1 is exposed. In second light transmission region $Ta_2$, a semi-shield film 3 is formed on the surface of transparent substrate 1, and the surface of semi-shield film 3 is exposed. In third light transmission region $Tn_1$, a trench 1a is formed at the surface of transparent substrate 1. Owing to trench 1a, exposure light, which travel through third light transmission region $Tn_1$, have the phase substantially different by 180 degrees from the phase of exposure light travelling through first light transmission region $Ta_1$. In fourth light transmission region $Tn_2$, semi-shield film 3 and a phase shift film 5 are layered on the surface of transparent substrate 1, and the surface of phase shift film 5 is exposed.

In shield region S, semi-shield film 3, phase shift film 5 and shield film 7 are layered on the surface of transparent substrate 1, and the surface of shield film 7 is exposed.

Semi-shield film 3 substantially has a transmission factor of 50%, and serves to damp the intensity of exposure light travelling therethrough. Phase shift film 5 serves to invert the phase of exposure light travelling therethrough by substantially 180 degrees without changing a quantity of the exposure light. Shield film 7 serves to interrupt exposure light.

Owing to the above structure, exposure light travelling through second light transmission region $Ta_2$ have the same phase as exposure light travelling through first light transmission region $Ta_1$, and has the intensity damped by 50%. Exposure light travelling through third light transmission region $Tn_1$ have the phase which is different by 180 degrees from that of exposure light travelling through first light transmission region $Ta_1$, and have the same intensity. Exposure light travelling through fourth light transmission region $Tn_2$ have the phase which is different by 180 degrees from that of exposure light travelling through first light transmission region $Ta_1$, and have the intensity damped by 50%.

When i-rays are used as exposure light, semi-shield film 3 is formed of an MoSi film having a thickness of 150 Å. Phase shift film 5 is a silicon nitride film having a refractivity of 2.09 and a thickness, e.g., of 1700 Å. Shield film 7 has a three-layer structure formed of a chrome oxide ($CrO_x$) film 7a, a chrome (Cr) film 7b and a chrome oxide film 7c. Chrome oxide film 7a, chrome film 7b and chrome oxide film 7c have thicknesses of 300 Å, 700 Å and 300 Å, respectively. Transparent substrate 1 is made of, e.g., quartz or crystal, and trench 1a formed at transparent substrate 1 has a depth of, e.g., 4150 Å.

At the hole pattern formation region, these first to fourth light transmission regions and the shield region each have a substantially square planar shape, and are arranged in a matrix form.

More specifically, in the structure where first and second regions $R_1$ and $R_2$ each having a substantially rectangular planar shape, four shield regions S spaced from each other are arranged at four corners of first region $R_1$, and second light transmission region $Ta_2$ is arranged at each of areas between these shield regions S. First light transmission region $Ta_1$, which is in contact with and surrounded by second light transmission regions $Ta_2$, is arranged at the substantially central area of first region $R_1$.

In second region $R_2$, four shield regions S spaced from each other are arranged at four corners, and fourth light transmission regions $Tn_2$ are arranged at areas between shield regions S, respectively. Third light transmission region $Tn_1$, which is in contact with and surrounded by fourth light transmission regions $Tn_2$, is arranged at the substantially central area of second region $R_2$.

First and second light transmission regions $R_1$ and $R_2$ commonly use one shield region S.

Two fourth regions $Tn_2$, between which shield region S is arranged, are arranged between adjacent first regions $R_1$. Two second regions $Ta_2$, between which shield region S is arranged, are arranged between adjacent second regions $R_2$.

In the line/space pattern formation region, first light transmission region $Ta_1$ and third light transmission region $Tn_1$ extend parallel to each other in the direction indicated by Y in the figure with shield region S therebetween.

Description will be given on a method of forming patterns with the phase shift mask of the embodiment.

Figure 4A:
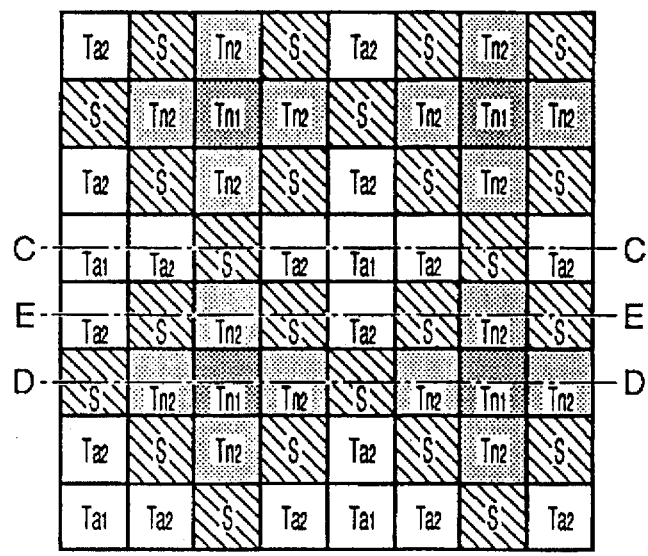
FIG. 4A is a plan schematically showing a structure of a phase shift mask of an embodiment of the invention.
Figure 4B:
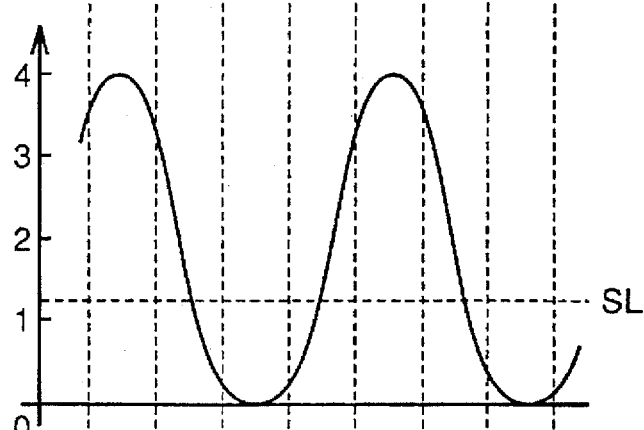
FIG. 4B shows a light intensity on a wafer along line C—C in FIG. 4A.

Referring to FIGS. 4A and 4B, first light transmission region $Ta_1$ transmits exposure light without substantially damping the intensity of exposure light, so that provides the highest light intensity on the wafer. Second light transmission region $Ta_2$ damps the intensity of exposure light, and therefore provides the light intensity lower than that by first light transmission region $Ta_1$ on the wafer. Shield region S interrupts exposure light, and therefore provides the light intensity of substantially 0 on the wafer.

Figure 4C:
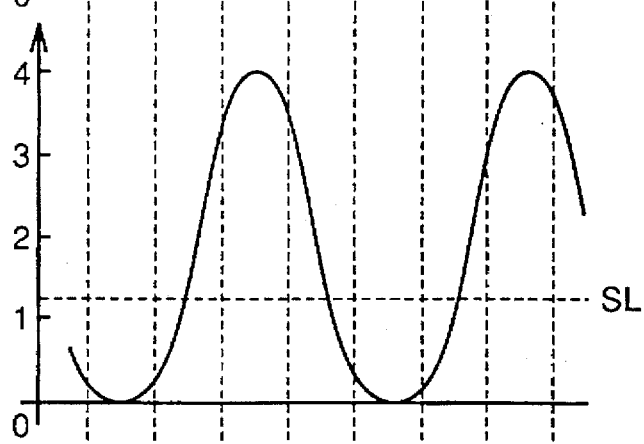
FIG. 4C shows a light intensity on the wafer along line D—D in FIG. 4A.

Referring to FIGS. 4A and 4C, third light transmission region $Tn_1$ transmits exposure light without substantially damping the intensity of exposure light, and therefore provides the highest light intensity on the wafer which is substantially the same as that by first light transmission region $Ta_1$. Fourth light transmission region $Tn_2$ damps the intensity of exposure light, and therefore provides the light intensity on the wafer, which is lower than that by third light transmission region $Tn_1$ and is substantially equal to that by second light transmission region $Ta_2$. Shield region S provides the light intensity of 0 on the wafer, as already described.

Figure 4D:
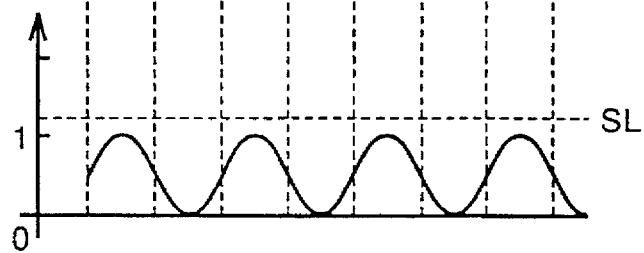
FIG. 4D shows a light intensity on the wafer along line E—E in FIG. 4A.

Referring to FIGS. 4A and 4D, exposure light transmitted through second and fourth light transmission regions $Ta_2$ and $Tn_2$ have the intensities lower than those of exposure light transmitted through first and third light transmission regions $Ta_1$ and $Tn_1$ as described above. Shield region S provides the light intensity of substantially 0 on the wafer as described before.

Figure 5:
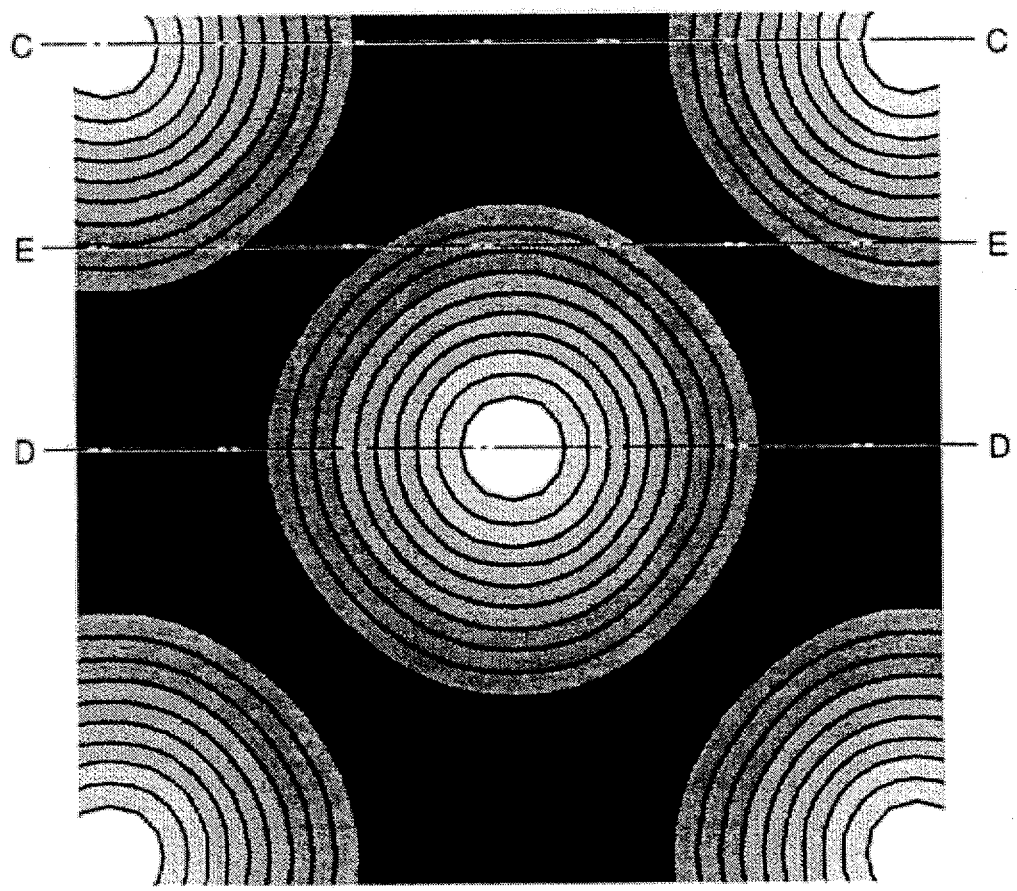
FIG. 5 shows an optical image produced with the phase shift mask of the embodiment of the invention.

The phase shift mask of the embodiment having the above structure provides the light intensity on the wafer having a planar distribution shown in FIG. 5.

Referring to FIG. 5, a black portion in the figure represents a region of a small light intensity, and a white portion represents a region of a large light intensity. Lines C—C, D—D and E—E in FIG. 5 correspond to lines C—C, D—D and E—E in FIG. 4A, respectively.

After the above exposure, development is performed in a normal manner, whereby photoresist at a light portion (white region in FIG. 5) is melted and removed to form a hole pattern, if the photoresist is of a positive type.

It can be seen that the phase shift mask of this embodiment shown in FIG. 4A provides the planar distribution of light intensity on the wafer, which is substantially the same as that by interference exposure shown in FIG. 30. Thus, the phase shift mask of the embodiment can provide the substantially same planar distribution of intensity of exposure light as that by interference exposure with the single phase shift mask.

A method of manufacturing the phase shift mask of the embodiment will be described below.

Figure 6:
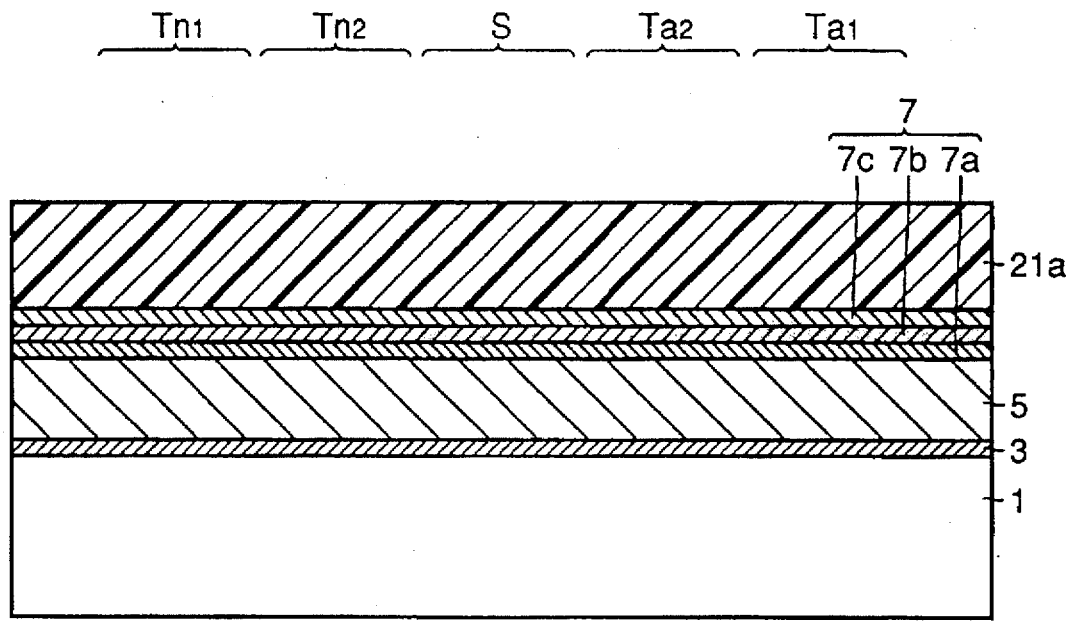
FIGS. 6 to 11 are schematic cross sections showing 1st to 6th steps in a method of manufacturing a hole pattern formation region in a phase shift mask of the embodiment of the invention, respectively.
Figure 12:
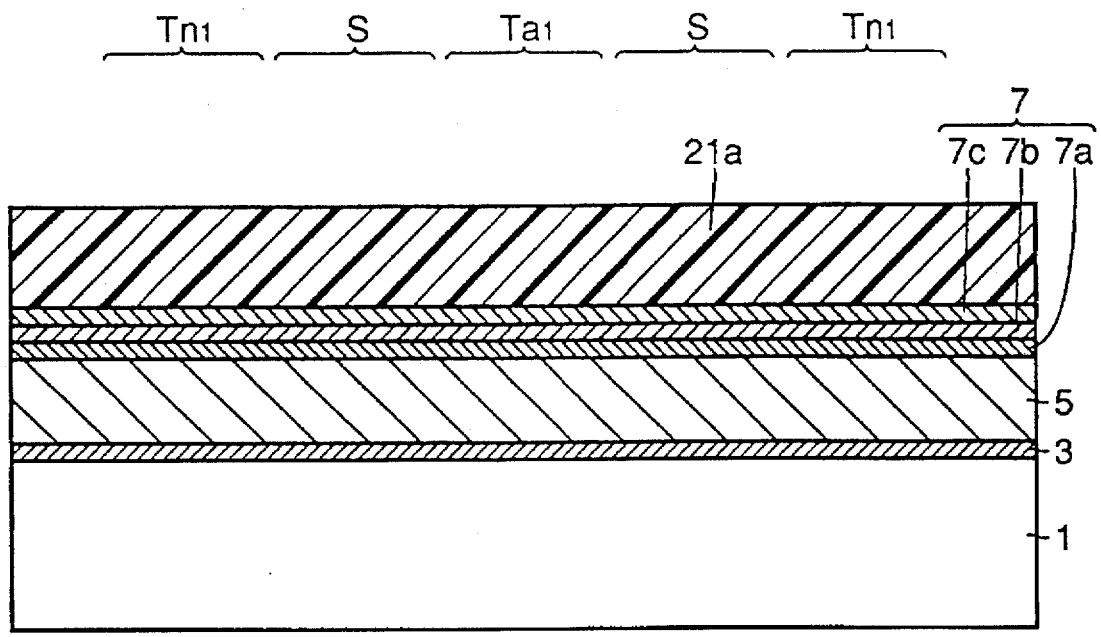
FIGS. 12 to 17 are schematic cross sections showing 1st to 6th steps in a method of manufacturing a line/space pattern formation region in a phase shift mask of the embodiment of the invention, respectively.

Referring to FIGS. 6 and 12, steps are performed to form successively semi-shield film 3, phase shift film 5 and shield film 7 on the surface of transparent substrate 1 made of, e.g., crystal. Thereby, the blank are formed.

Semi-shield film 3 is formed, e.g., by sputtering, and is made of an MoSi film of 150 Å in thickness. Phase shift film 5 is formed, e.g., by a low pressure CVD (Chemical Vapor Deposition) method, and is made of a silicon nitride film of 1700 Å in thickness. The shield film 7 is formed of chrome oxide film 7a of 300 Å in thickness, chrome film 7b of 700 Å in thickness and chrome oxide film 7c of 300 Å in thickness forming the three-layer structure.

Electron beam (EB) resist 21a is applied to shield film 7. Thereafter, EB resist 21a is patterned, e.g., by electron beam (EB) drawing into a predetermined configuration.

Figure 7:
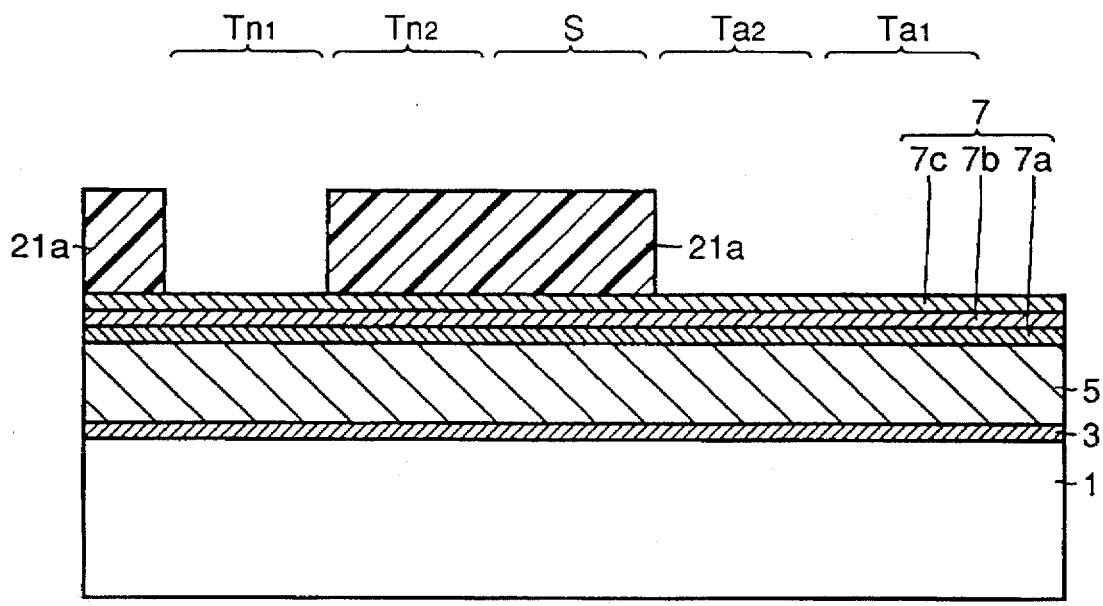
Figure 13:
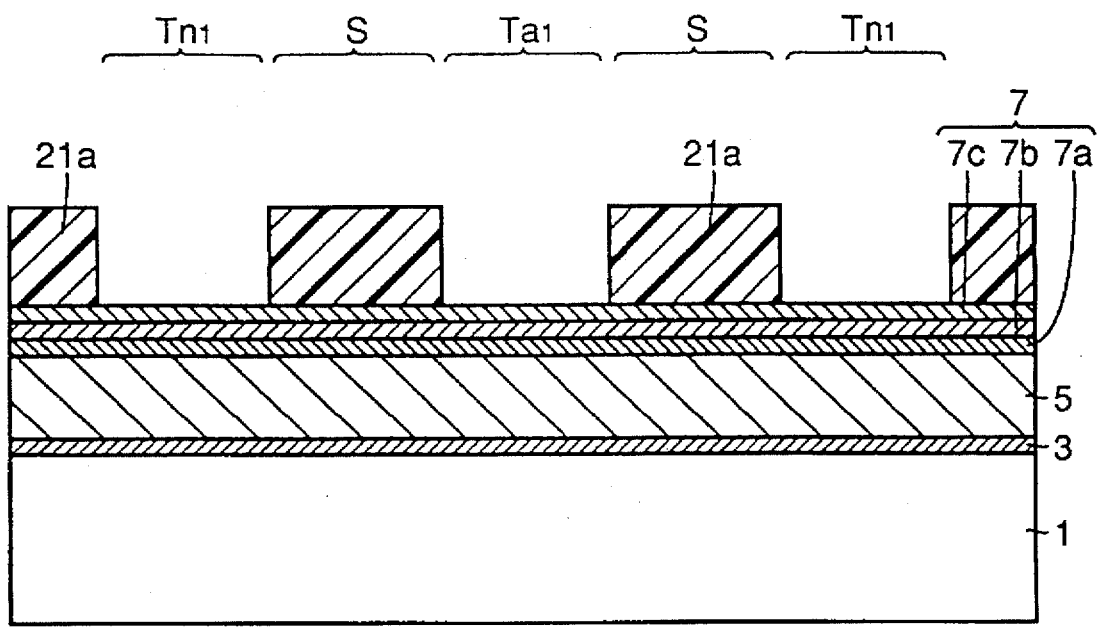

Referring to FIGS. 7 and 13, the above process leaves resist pattern 21a at fourth light transmission region $Tn_2$ and shield region S in the hole pattern formation region, and also leaves resist pattern 21a at shield region S in the line/space pattern formation region.. Using resist pattern 21a as a mask, shield film 7 is removed by wet etching. Thereafter, inspection and correction of a defect in the pattern of shield film 7 are performed. Still using resist pattern 21a as a mask, reactive ion etching (RIE) with $CF_4/O_2$ is effected on phase shift film 5 made of a silicon nitride film.

Figure 8:
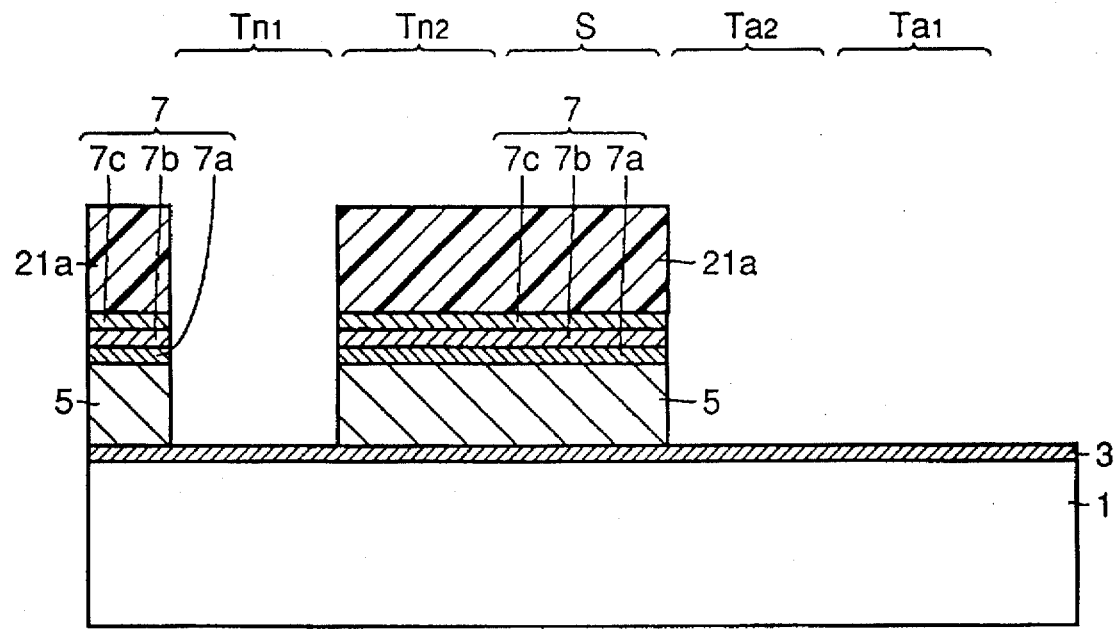
Figure 14:
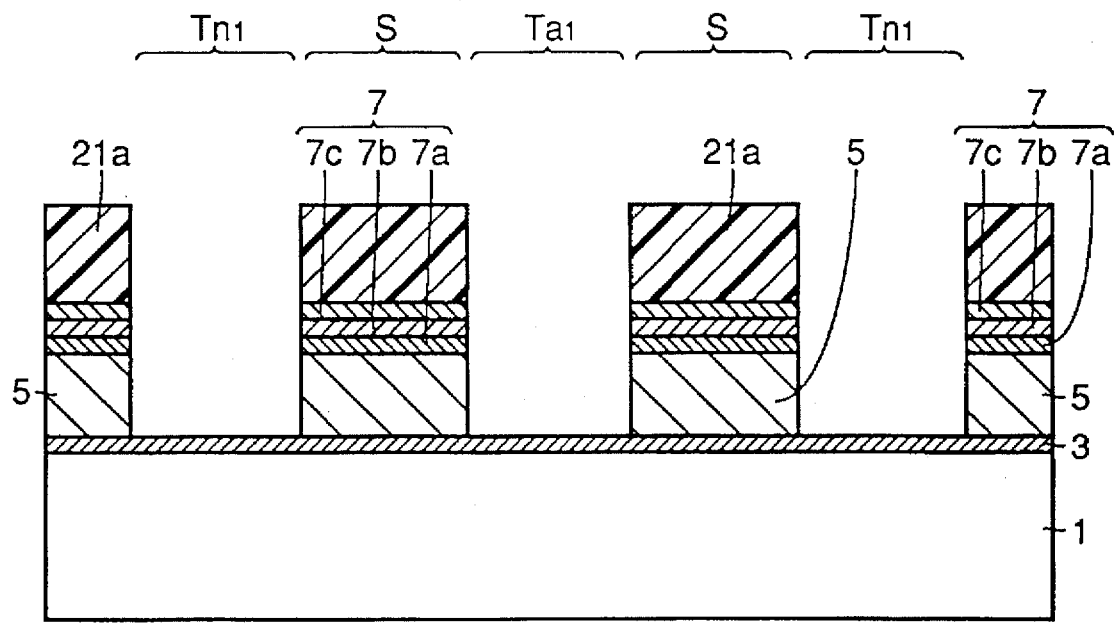

Referring to FIGS. 8 and 14, the surface of semi-shield film 3 is exposed at first, second and third light transmission regions $Ta_1$, $Ta_2$ and $Tn_1$. Thereafter, resist pattern 21a is removed.

It is preferable that shield film 7 has a resistance against etching which is effected on phase shift film 5. The reason for this is to prevent the following disadvantage. Generally, the surface of shield film 7 is partially exposed through resist pattern 21b during the etching of phase shift film 5. Therefore, if the exposed portion of shield film 7 were etched when phase shift film is etched, it would be impossible to form shield film 7 and phase shift film 5 having precise configurations.

Figure 9:
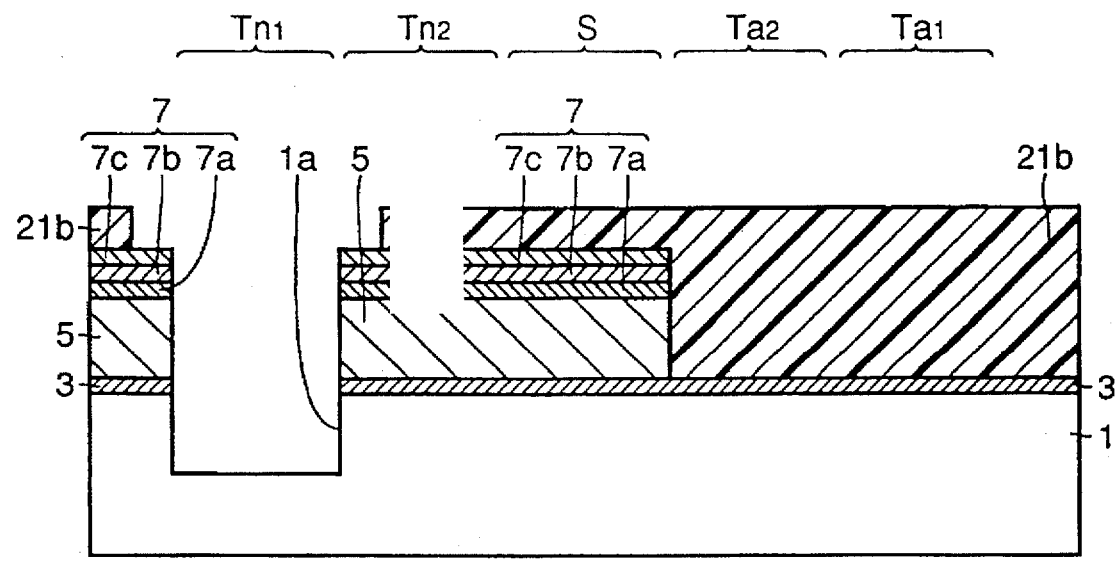
Figure 15:
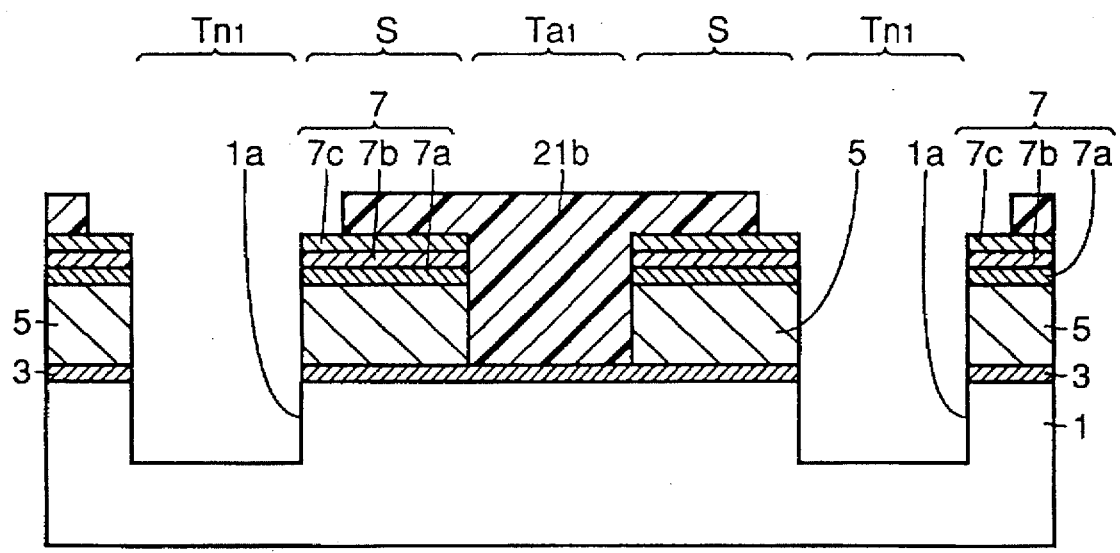

Referring to FIGS. 9 and 15, EB resist 21b is applied, and then is patterned by EB drawing into a predetermined configuration. This forms resist pattern 21b exposing at least third light transmission region $Tn_1$. Using this resist pattern 21b as a mask, RIE is effected on semi-shield film 3 made of an MoSi film with $CF_4/O_2$ to expose the surface of transparent substrate 1. Thereafter, RIE is further effected with $CHF_3/CO_2/Ar$ on the exposed surface of transparent substrate 1 to form trench 1a at transparent substrate 1. Thereafter, resist pattern 21b is removed.

It is preferable that shield film 7 has a resistance against etching which is effected on substrate 3 and transparent substrate 1. The reason for this is to prevent the following disadvantage. Since the surface of shield film 7 is partially exposed through resist pattern 21b during etching of semi-shield film 3 as described above, shield film 7 of an intended configuration would not be formed, if shield film 7 did not have the resistance against etching effected on semi-shield film 3 and others.

Figure 10:
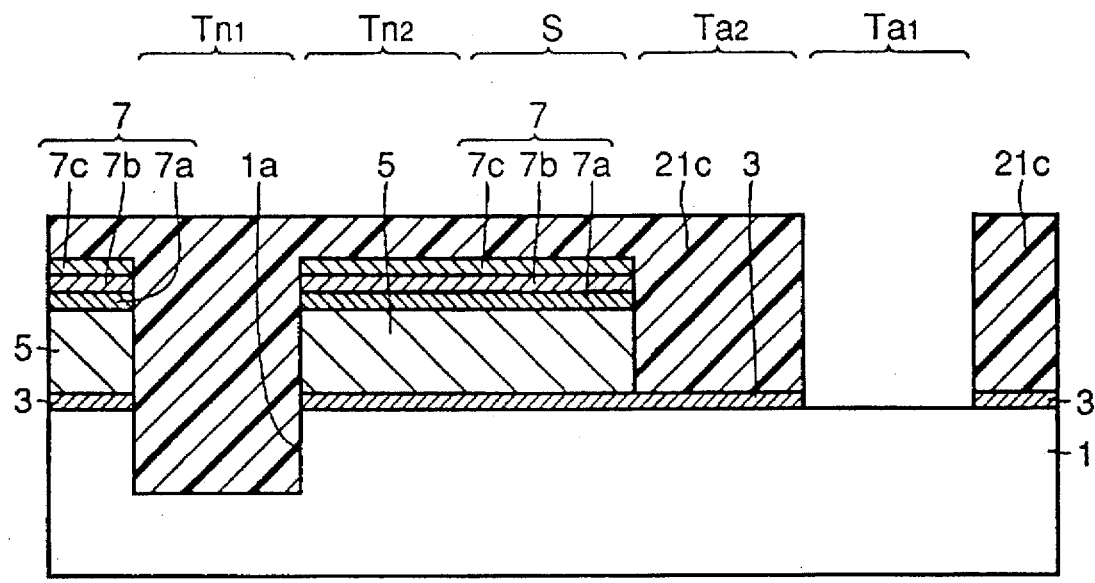
Figure 16:
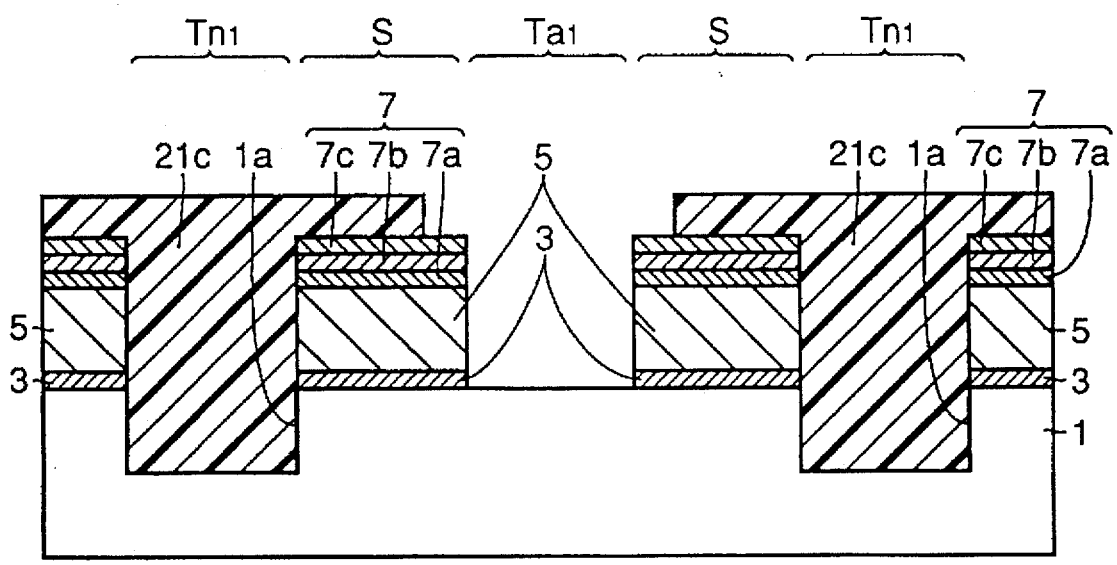

Referring to FIGS. 10 and 16, EB resist 21c is applied, and then is patterned by EB drawing into a predetermined configuration. This forms resist pattern 21c exposing at least first light transmission region $Ta_1$. Using this resist pattern 21c as a mask, RIE is effected with $CF_4/O_2$ to remove semi-shield film 3 and thereby expose the surface of transparent substrate 1. Thereafter, resist pattern 21c is removed.

Figure 11:
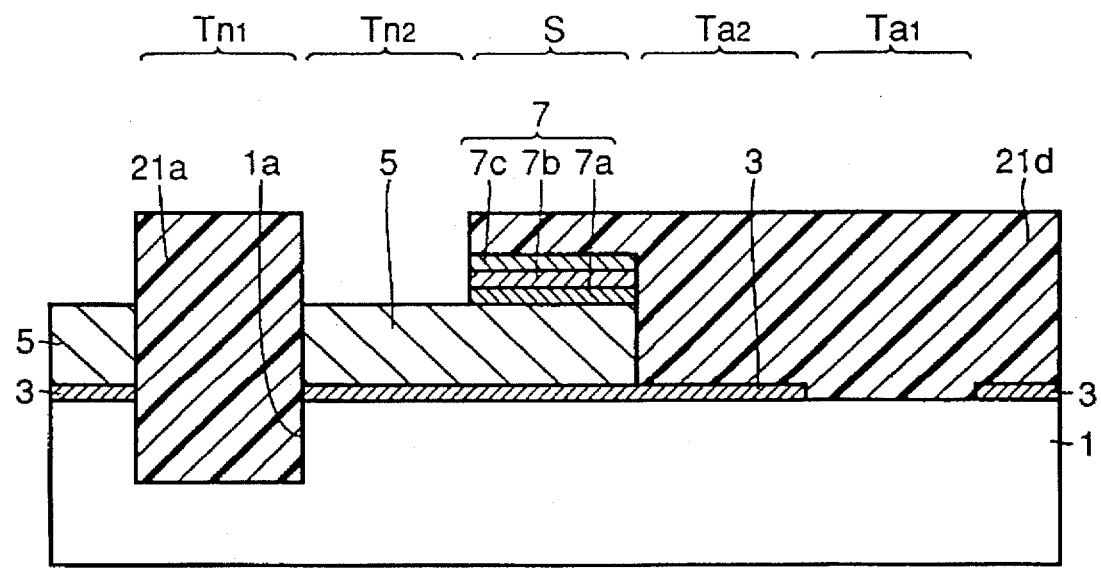
Figure 17:
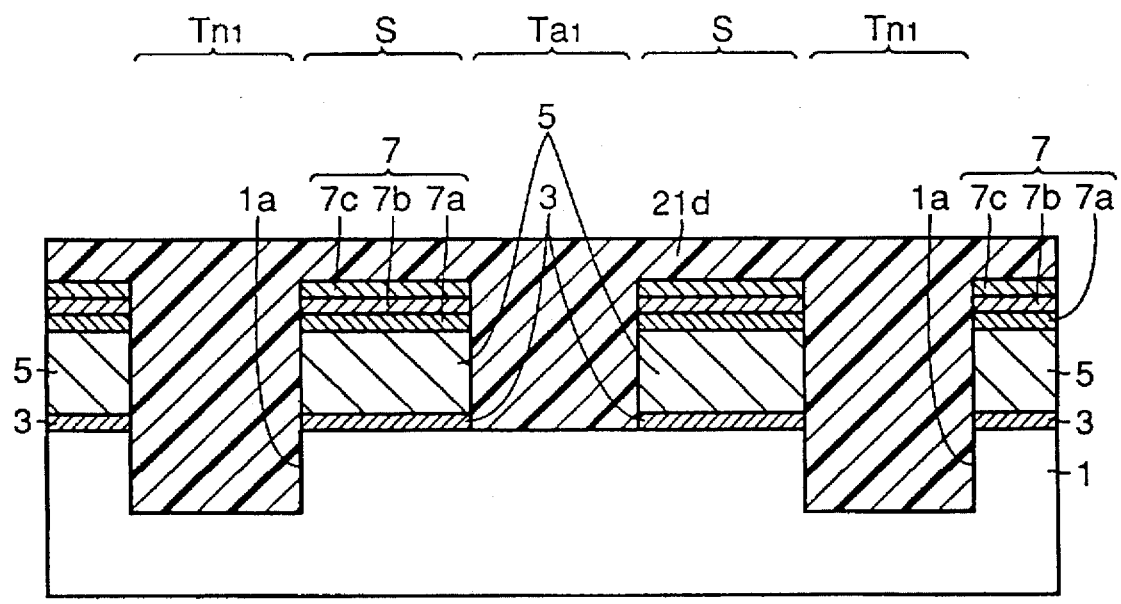

Referring to FIGS. 11 and 17, EB resist 21d is applied, and is patterned into a predetermined configuration by EB drawing. This forms resist pattern 21d exposing fourth light transmission region $Tn_2$. Using this resist pattern 21d as a mask, wet etching is performed to expose the surface of phase shift film 5 by removing shield film 7. Inspection and correction of a defect in the pattern of shield film 7 are performed. Thereafter, resist pattern 21d is removed, so that the phase shift mask of the embodiment shown in FIGS. 1 to 3 is completed.

Simulation is performed for determining lowering of the intensity of exposure light in a state of defocus with the phase shift mask of the embodiment. A method and a result of the simulation will be described below.

The phase shift mask of this embodiment used in this simulation included first to fourth light transmission regions and the shield region in FIG. 1, each of which had a planar form having longitudinal and lateral sizes $L_1$ and $L_2$ of 0.14 μm.

Figure 18:
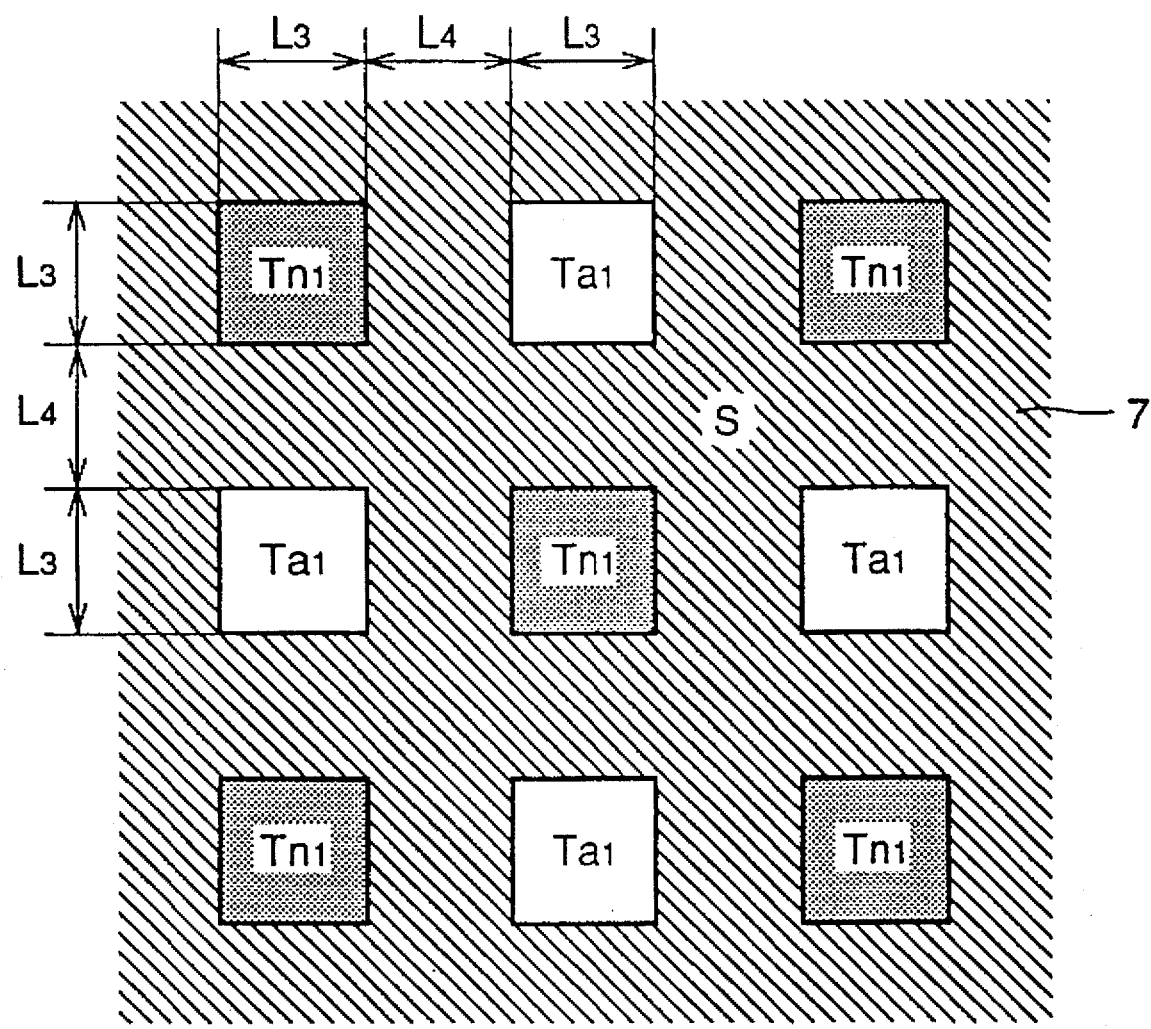
FIG. 18 is a plan schematically showing a structure of a phase shift mask for comparison used in simulation of reduction in intensity of exposure light in a defocus state.

A phase shift mask used as a specimen for comparison was also prepared, as shown in FIG. 18. Referring to FIG. 18, this phase shift mask had a structure corresponding to that of the phase shift mask of the present embodiment shown in FIG. 1, provided that damping transmission regions (second and fourth light transmission regions $Ta_2$ and $Tn_2$) were eliminated and first and third light transmission regions $Ta_1$ and $Tn_1$ were regularly and alternately arranged. In this specimen, first and third light transmission regions $Ta_1$ and $Tn_1$ had longitudinal and lateral sizes of 0.2 μm, and a size L4 between first and third light transmission regions $Ta_1$ and $Tn_1$ was 0.2 μm.

As can be seen from the above, the sizes of each of the specimens are determined to provide the space of about 0.2 μm between the hole patterns formed by these specimens.

With these phase shift masks, optical images of hole patterns were determined in the states of just-focus and defocus of 1.0 μm. This determination was performed under the conditions that a numerical aperture was 0.55, a coherence a was 0.2 and exposure light was KrF light. The results are shown in FIGS. 19 to 22.

Figure 19:
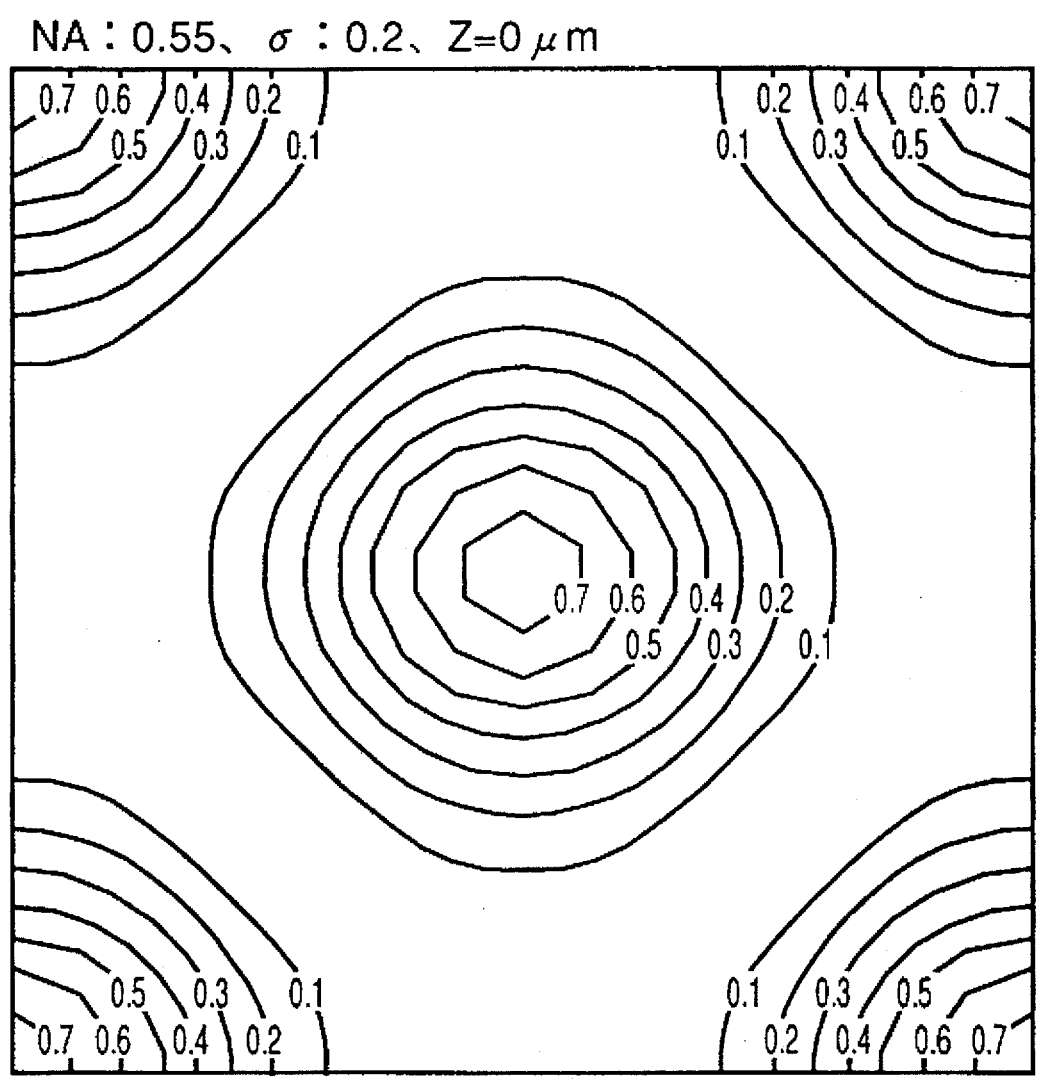
FIG. 19 shows an optical image formed in a just-focus state with the phase shift mask in the embodiment of the invention.
Figure 20:
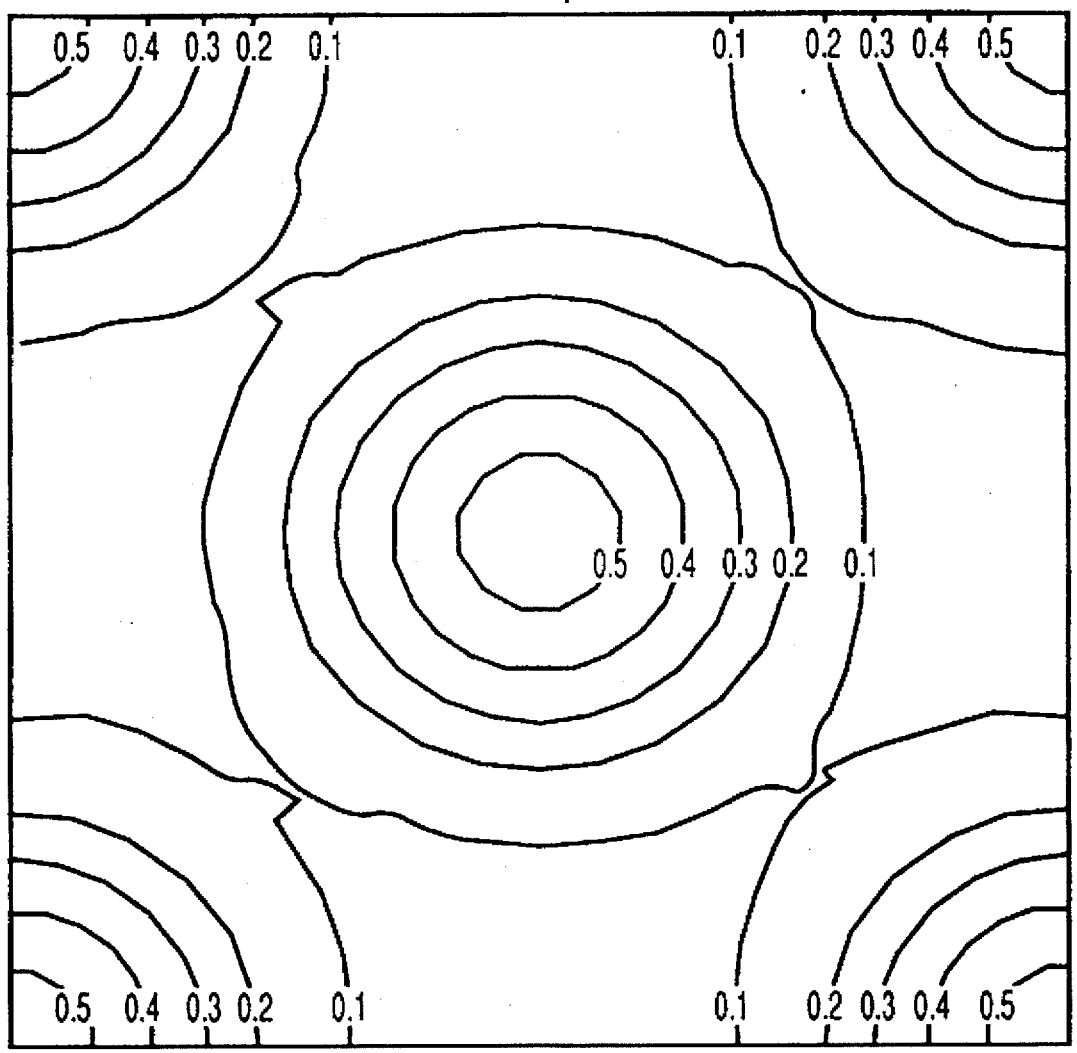
FIG. 20 shows an optical image formed in a state of defocus of 1.0 μm with the phase shift mask in the embodiment of the invention.

FIGS. 19 and 20 show optical images on the photoresist formed with the phase shift mask of the embodiment in the states of just-focus and defocus of 1.0 μm. As can be seen from FIGS. 19 and 20, the phase shift mask of the embodiment can provide the peak intensity of exposure light of up to 0.8 in the state of just-focus (Z=0 μm). In the state of defocus of 1.0 μm (Z=1.0 μm), it provides the peak intensity of exposure light of up to 0.6. From these results, it can be seen that the phase shift mask of the embodiment provides the peak intensity in the state of defocus of 1.0 μm which is about 75% of the peak intensity in the state of just-focus.

Figure 21:
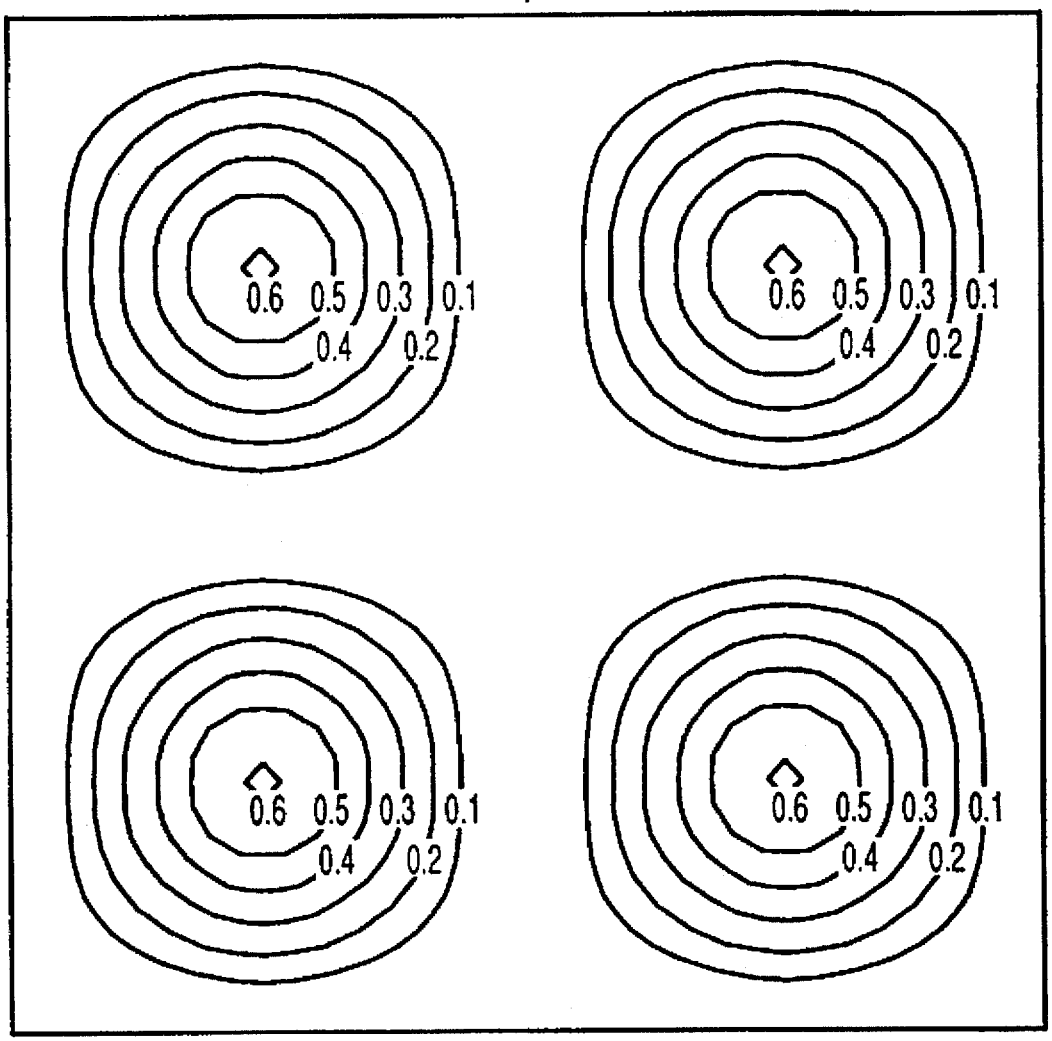
FIG. 21 shows an optical image formed in a state of just-focus with the phase shift mask shown in FIG. 18.
Figure 22:
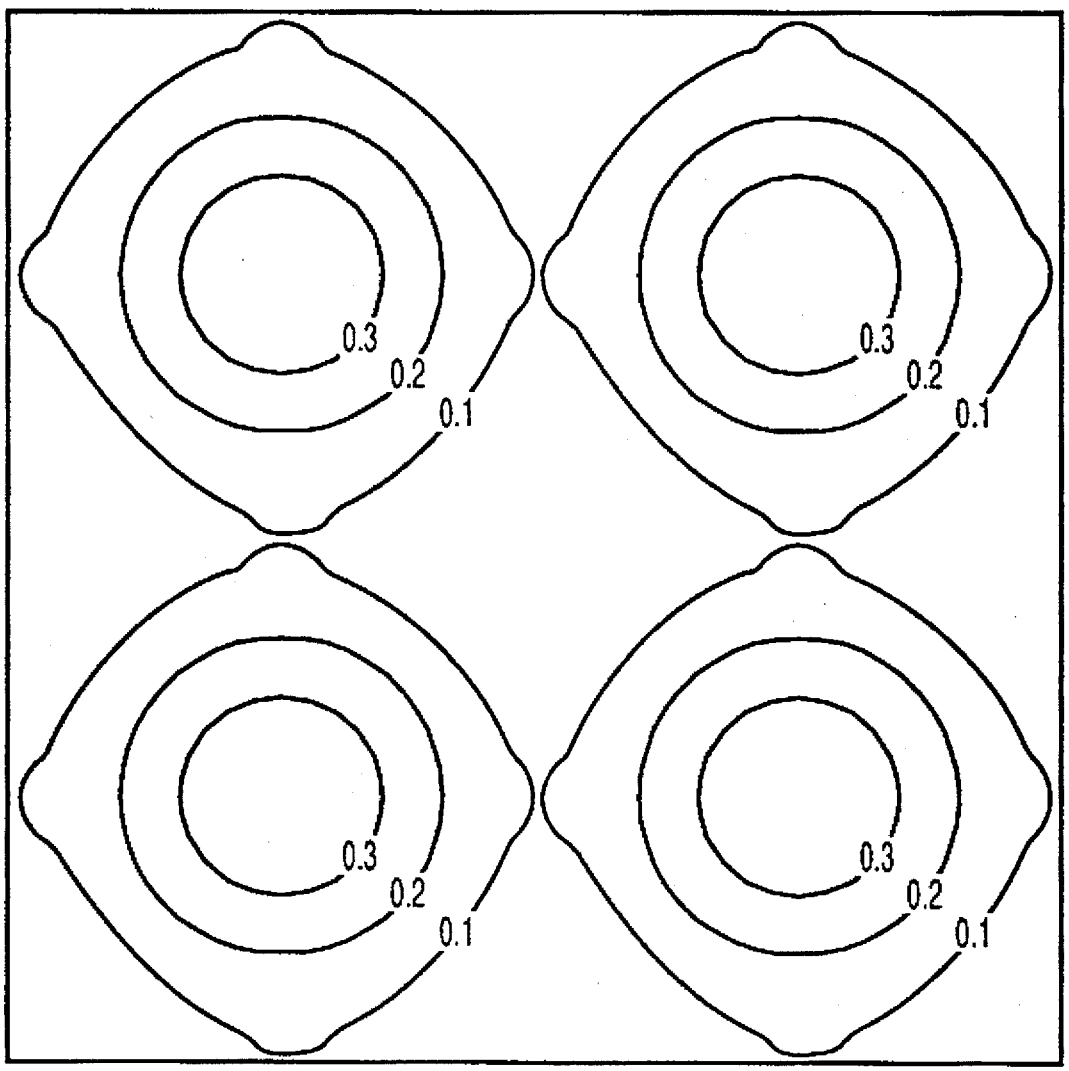
FIG. 22 shows an optical image formed in a state of defocus of 1.0 μm with the phase shift mask shown in FIG. 18.
Figure 23A:
FIG. 23A shows a section of a mask using a conventional photomask.
Figure 23B:
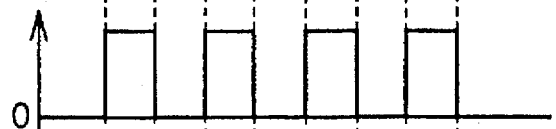
FIG. 23B shows an electric field on the mask in FIG. 23A.
Figure 23C:
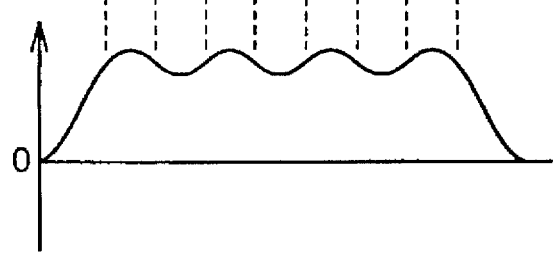
FIG. 23C shows a light intensity on a wafer.
Figure 24A:
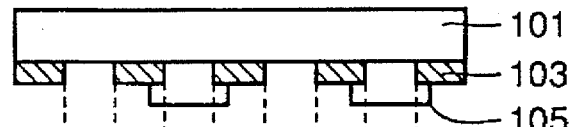
FIG. 24A shows a section of a mask using a phase shift mask of a Levenson type.
Figure 24B:
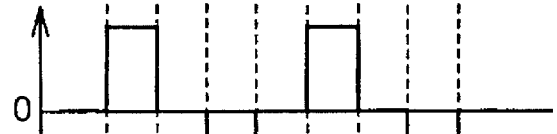
FIG. 24B shows an electric field on the mask in FIG. 24A.
Figure 24C:
FIG. 24C shows a light intensity on a wafer.
Figure 25A:
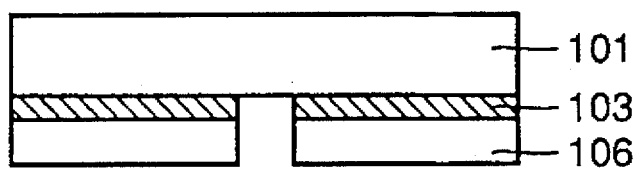
FIG. 25A shows a section of a mask using a phase shift mask of a halftone type.
Figure 25B:
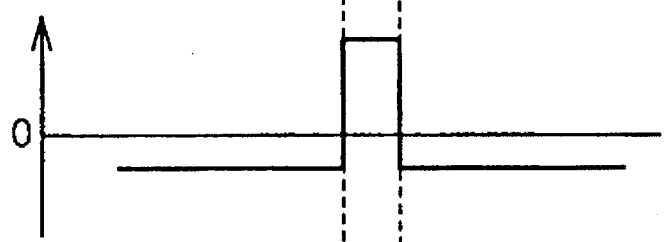
FIG. 25B shows an electric field on the mask in FIG. 25A.
Figure 25C:
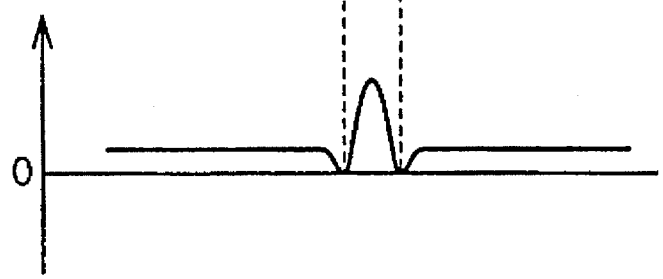
FIG. 25C shows a light intensity on a wafer.

FIGS. 21 and 22 show optical images on the photoresist formed with the phase shift mask shown in FIG. 18 in the states of just-focus and defocus of 1.0 μm.

As can be seen from FIGS. 21 and 22, the phase shift mask in FIG. 18 can provide the peak intensity of exposure light of up to 0.7 in the state of just-focus (Z=0 μm). In the state of defocus of 1.0 μm (Z=1.0 μm), it provides the peak intensity of exposure light of up to 0.35. From these results, it can be seen that the phase shift mask shown in FIG. 18 provides the peak intensity in the state of defocus of 1.0 μm which is about 50% of the peak intensity in the state of just-focus.

From the above results of simulation, it can be found that the phase shift mask of the embodiment suppresses lowering of the peak intensity of exposure light in the state of defocus, compared with the phase shift mask shown in FIG. 18. Thus, it can be found that lowering of the peak intensity of exposure light in the state of defocus can be suppressed to a higher extent by provision of the damping transmission regions (second and fourth light transmission regions $Ta_2$ and $Tn_2$) which damp the intensity of exposure light, as is employed in this embodiment.

In FIGS. 19 to 22, solid lines show contours of the light intensity of exposure light, and the values appended to the contours represent the intensity of exposure light.

Although the scale of optical images in FIGS. 19 and 20 is different from that in FIGS. 21 and 22, the difference is only the scale, and exposure conditions such as a scaling ratio are the same except for those already described.

The phase shift mask of the embodiment is provided with first to fourth light transmission regions $Ta_1$, $Ta_2$, $Tn_1$ and $Tn_2$ providing different phases or different intensities of the exposure light. By appropriate planar arrangement of the first to fourth light transmission regions in FIG. 1, it is possible to obtain the distributions of exposure light which are shown in FIGS. 4A to 4D and are substantially the same as those in the prior art utilizing interference exposure shown in FIG. 30. Therefore, hole patterns can be precisely formed at a fine pitch on the photoresist of the positive type only with the single phase shift mask.

Figure 26:
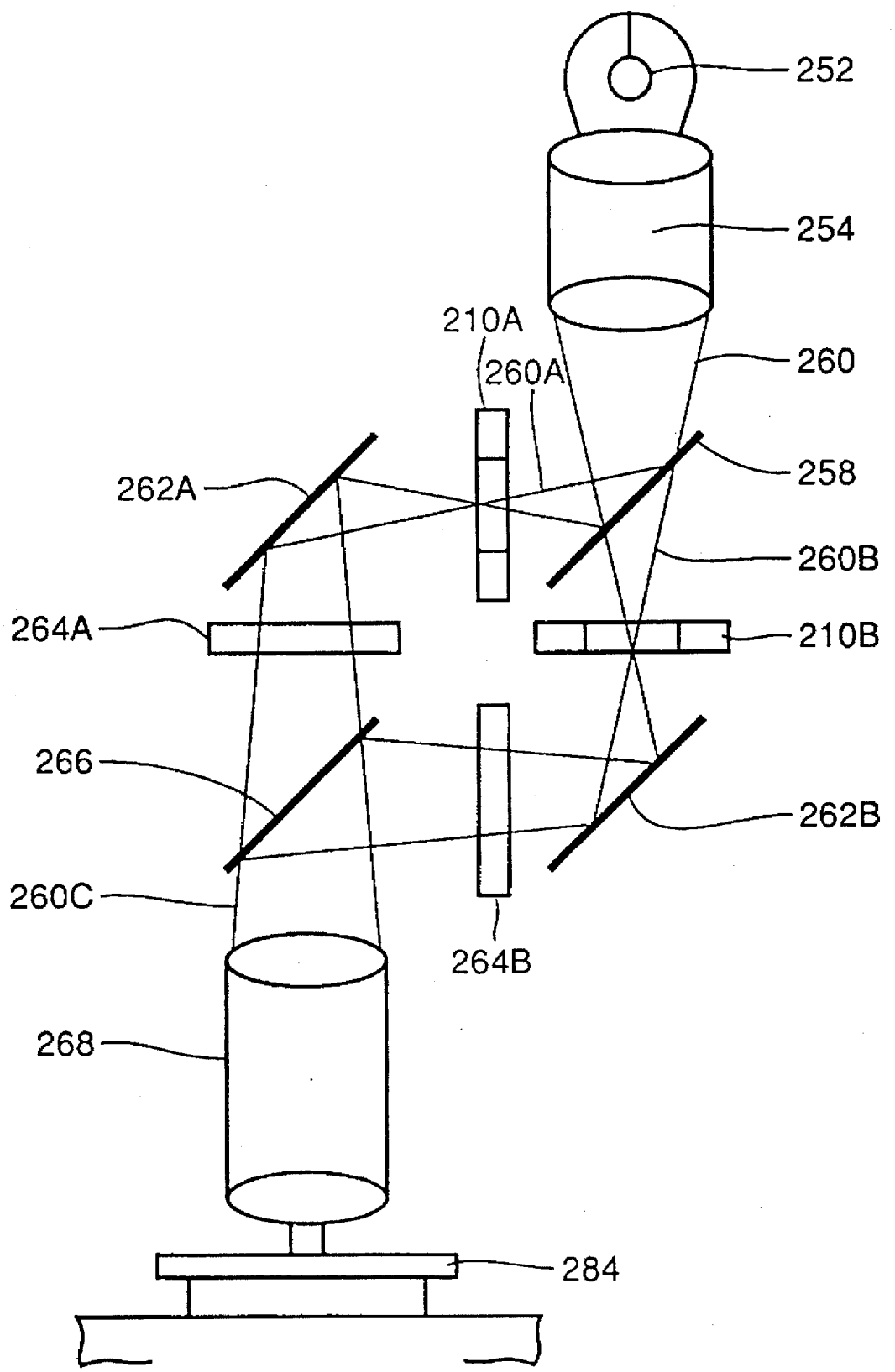
FIG. 26 schematically shows an exposure apparatus for illustrating an exposing method with a conventional phase shift mask.
Figure 27:
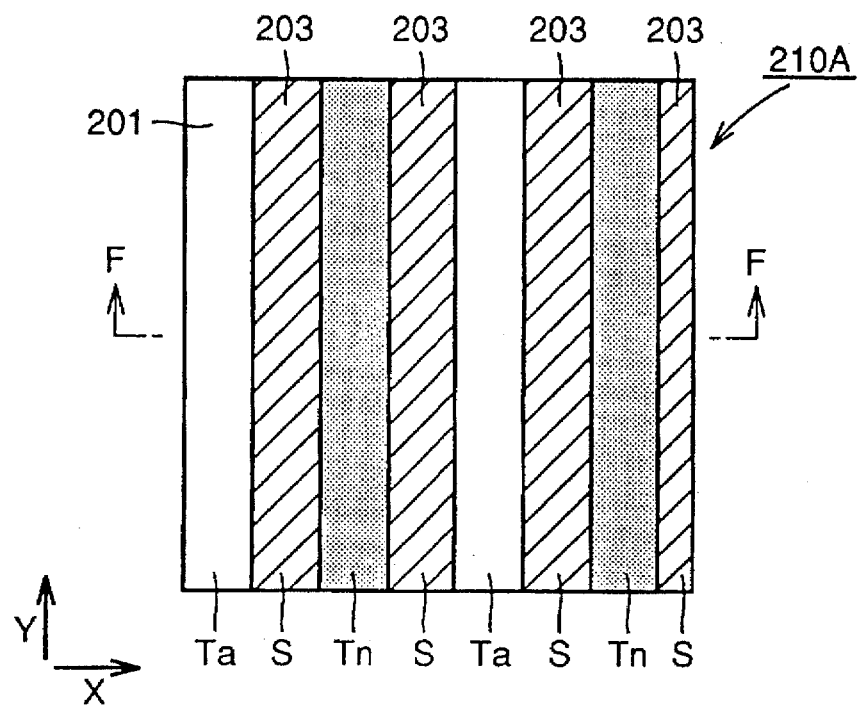
FIG. 27 is a plan schematically showing a structure of a first phase shift mask used in the conventional exposing method.
Figure 28:
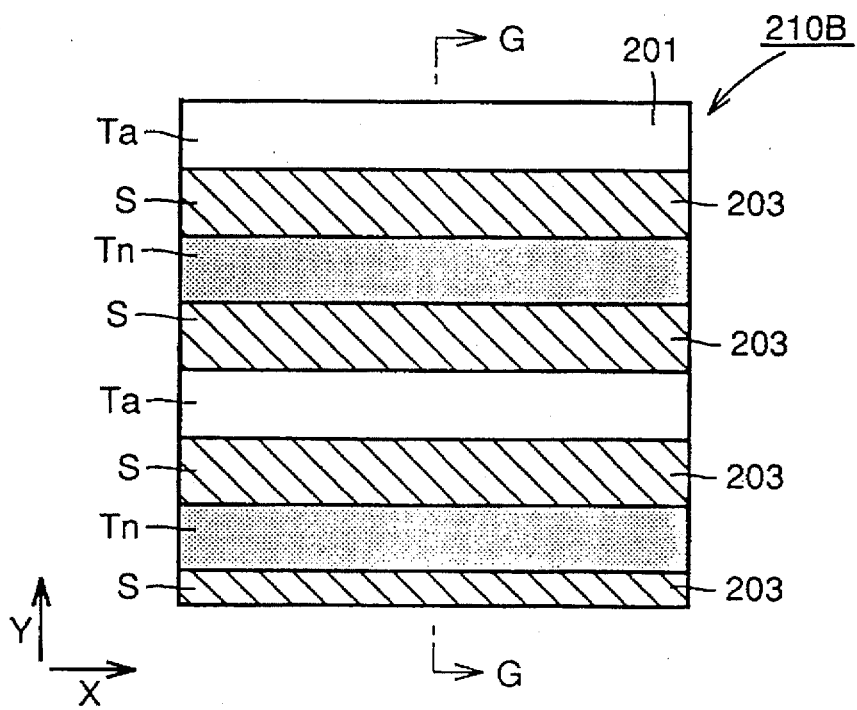
FIG. 28 is a plan schematically showing a structure of a second phase shift mask used in the conventional exposing method.
Figure 29:
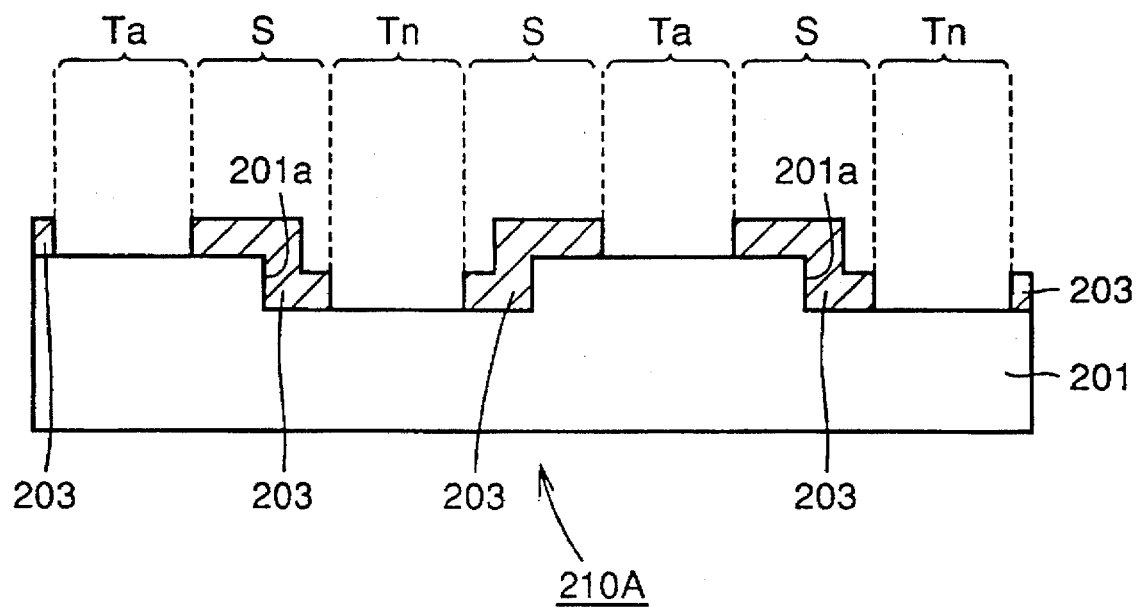
FIG. 29 is a schematic cross section taken along line F—F in FIG. 27.
Figure 30A:
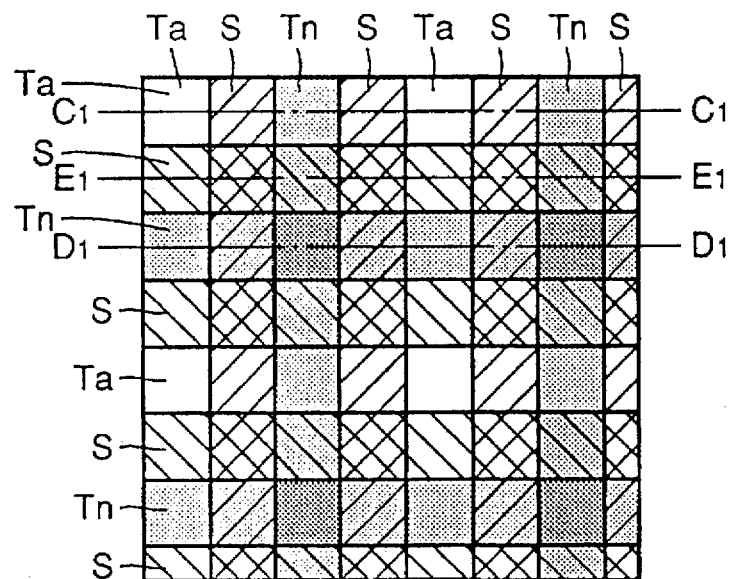
FIG. 30A is a plan showing the first and second phase shift masks overlapped together.
Figure 30B:
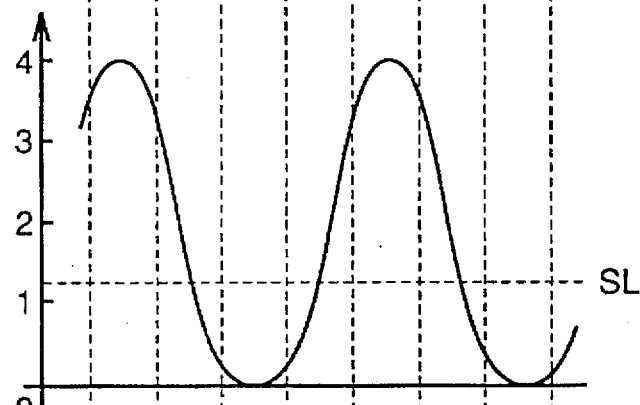
FIG. 30B shows a light intensity on a wafer taken along line $C_1$—$C_1$ in FIG. 30A.
Figure 30C:
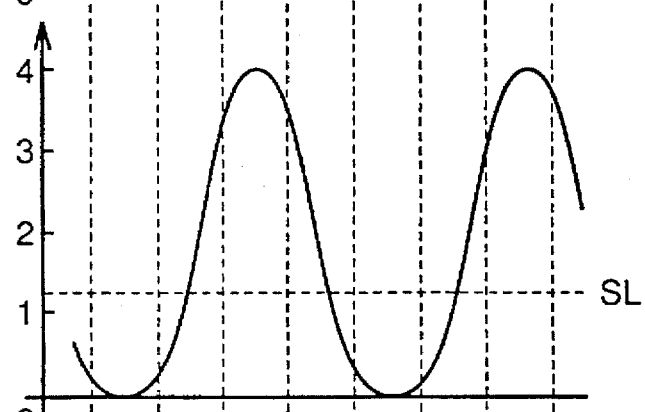
FIG. 30C shows the light intensity on the wafer taken along line $D_1$—$D_1$ in FIG. 30A.
Figure 30D:
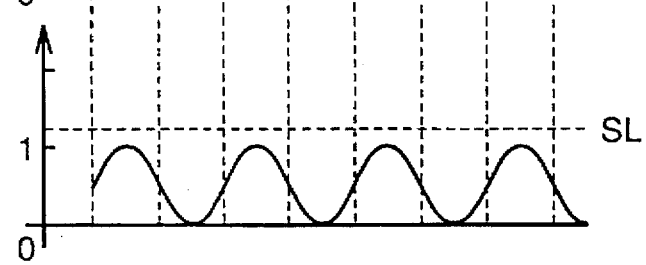
FIG. 30D shows the light intensity on the wafer taken along line $E_1$—$E_1$ in FIG. 30A.

Since exposure is required to form the image of only the single phase shift mask, the exposure apparatus is not required to have a complicated structure in contrast to the prior art shown in FIG. 26. Accordingly, hole patterns at a fine pitch can be precisely formed on the photoresist of a positive type by the exposure apparatus of a simple structure.

The phase shift mask of the embodiment, as described above, is provided with damping transmission regions such as second and fourth light transmission regions $Ta_2$ and $Tn_2$. Therefore, it is possible to suppress lowering of the intensity of exposure light in the state of defocus, compared with the phase shift mask (FIG. 18) not provided with the damping transmission region.

There are arranged first to fourth light transmission regions $Ta_1$, $Ta_2$, $Tn_1$ and $Tn_2$ providing different phases or different intensities of transmitted light. Therefore, the phase shift mask can be provided with both the hole pattern formation region and the line/space pattern formation region as shown in FIG. 1, and patterns at a high resolution can be formed at both of these formation regions. This also provides such an advantage that the phase shift mask of the embodiment can be applied to various forms compared with the phase shift mask of a mere halftone type.

According to a method of manufacturing the phase shift mask of the embodiment, trench $1a$ is formed at transparent substrate 1 by etching substrate 1 masked with patterned semi-shield film 3 as shown in. FIGS. 8 and 9. Thus, the shift pattern at the background is formed after patterning semi-shield film 3. Therefore, semi-shield film 3 can be patterned without keeping proper alignment with the shift pattern at the background. Thus, precise alignment for aligning semi-shield film 3 with the shift pattern at the background is not required for patterning semi-shield film 3 and others.

As shown in FIG. 6, the blank are formed by successively forming semi-shield film 3, phase shift film 5 and shield film 7 on the surface of transparent substrate 1. After the blank are formed in this manner, any film other than photoresist will not be formed. Therefore, it is possible to prevent a defect in a film, which may be caused if a new film is deposited after patterning the film of blank or transparent substrate 1. Accordingly, the phase shift mask with fewer defects can be manufactured.

In the method of manufacturing the pattern with the phase shift mask of the embodiment, hole patterns can be precisely formed at a fine pitch on the photoresist of a positive type by the exposure apparatus of a simple structure using the single mask.

In the above embodiment, materials and sizes of various parts and portions are not restricted to those already described, and may be determined as described in the following items (1) to (5).

(1) For example, even in the case where i-rays are used as is done in the above embodiment, phase shift film 5 may be formed of a silicon oxide film instead of a silicon nitride film. In this case, the silicon oxide film has a refractivity of 1.45 and a thickness of 4150 Å, and is formed by a plasma CVD method. Materials and film thicknesses other than the above as well as the manufacturing method are the same as those in the embodiment described above.

(2) In the case where i-rays are used, semi-shield film 3 may be formed of a chrome film of 100 Å in thickness formed by sputtering instead of the MoSi film. Materials and film thicknesses other than the above as well as the manufacturing method are the same as those in the embodiment already described or the above item (1).

(3) KrF-rays may be used instead of i-rays. In this case, phase shift mask 5 may be a silicon oxide film having a thickness of 2500 Å and a refractivity of 1.50, and manufactured by a plasma CVD method. Semi-shield film 3 may be a chrome film having a thickness of 70 Å and formed by sputtering. Trench $1a$ in FIG. 1 has a depth of 2500 Å. Shield film 7 may have a three-layer structure formed of chrome oxide film $7a$ of 300 Å in thickness, chrome film $7b$ of 700 Å in thickness and chrome oxide film $7c$ of 300 Å in thickness.

(4) In the case where KrF-rays are used, phase shift film 5 may be formed of a silicon nitride film instead of a silicon oxide film. In this case, the silicon nitride film has a refractivity of 2.27 and a film thickness of 1000 Å, and is formed by a low pressure CVD method. Materials and film thicknesses other than the above as well as the manufacturing method are the same as those in the above item (3).

(5) In the case where KrF-rays are used, semi-shield film 3 may be made of an MoSi film of 100 Å in thickness instead of the chrome film. Materials and film thicknesses other than the above as well as the manufacturing method are the same as those in the above item (3) or (4).

Although the present invention has been described and illustrated in detail, it is clearly understood that the same is by way of illustration and example only and is not to be taken by way of limitation, the spirit and scope of the present invention being limited only by the terms of the appended claims.

The phase shift mask of the invention is provided with first to fourth light transmission regions providing different phases or different intensities of the exposure light. By appropriately arranging the first to fourth light transmission regions, it is possible to obtain the distribution of exposure light which is similar to those in the prior art. Therefore, hole patterns can be precisely formed at a fine pitch on the photoresist of the positive type only with the single phase shift mask.

Since exposure is required to form the image of only the single phase shift mask, the exposure apparatus is not required to have a complicated structure in contrast to the prior art. Accordingly, hole patterns at a fine pitch can be precisely formed on the photoresist of a positive type by the exposure apparatus of a simple structure.

By appropriate arrangement of the first and third light transmission regions, it is possible to form not only hole patterns but also patterns of line/space. Therefore, the mask can be applied to patterns of various forms compared with a phase shift mask of a mere halftone type.

According to the method of manufacturing the phase shift mask of the invention, the trench is formed at the substrate by etching the substrate masked with the patterned semi-shield film or the like. Thus, the shift pattern at the background is formed after patterning the semi-shield film or the like. Therefore, the semi-shield film or the like can be patterned without keeping proper alignment with the shift pattern at the background which is already formed. Therefore, semi-shield film can be patterned without requiring precise alignment for aligning the semi-shield film with the shift pattern at the background.

The blanks are formed by successively forming the semi-shield film, phase shift film and shield film on the main surface of the substrate. After the blanks are formed in this manner, it is not necessary to form any film other than photoresist. Therefore, it is possible to prevent a defect in a film, which may be caused if a new film is deposited after patterning the film of blanks or the substrate. Accordingly, the phase shift mask with fewer defects can be manufactured.

In the method of manufacturing the pattern with the phase shift mask of the invention, hole patterns can be precisely formed at a fine pitch on the photoresist of the positive type with the exposure apparatus of a simple structure using the single mask.

What is claimed is:

1. A phase shift mask comprising:
   a substrate having first, second, third and fourth light transmission regions allowing transmission of exposure light therethrough, having a shield region interrupting exposure light, and provided at a main surface of said third light transmission region with a trench such that a phase of the exposure light transmitted through said third light transmission region is different from that of the exposure light transmitted through said first and second light transmission regions;
   a semi-shield film formed on the main surface of said substrate for damping the intensity of the exposure light, covering said second and fourth light transmission regions, and exposing said first and third light transmission regions;
   a phase shift film formed on the main surface of said substrate, covering said fourth light transmission region and exposing said first, second and third light transmission regions for setting a phase of the exposure light transmitted through said fourth light transmission region to be different from that of the exposure light transmitted through said first and second light transmission regions and to be substantially equal to that of the exposure light transmitted through said third light transmission region; and
   a shield film formed on the main surface of said substrate, covering said shield region and exposing said first, second, third and fourth light transmission regions.

2. The phase shift mask according to claim 1, wherein said semi-shield film and said phase shift film are formed on the main surface of said substrate at said shield region.

3. The phase shift mask according to claim 1, wherein the main surface of said substrate has first and second plane regions each having a substantially square planar shape;
   four shield regions spaced from each other are formed at four corners of said first plane region;
   said second light transmission region is arranged at each of areas extending along the four sides defining the planar shape of said first plane region, respectively, and located between said shield regions;
   said first light transmission region is arranged at a substantially central portion of said first plane region and is in contact with each of said second light transmission regions arranged within said first plane region;
   four shield regions spaced from each other are arranged at four corners of said second plane region;
   said fourth light transmission region is arranged at each of areas extending along the four sides defining the planar shape of said second plane region, respectively, and located between said shield regions; and
   said third light transmission region is arranged at a substantially central portion of said second plane region and is in contact with each of said fourth light transmission regions arranged within said second plane region.

4. The phase shift mask according to claim 3, wherein one of said shield regions in said first plane region and one of said shield regions in said second plane region are commonly used by said first and second plane regions.

5. The phase shift mask according to claim 3, further comprising a third plane region on the main surface of said substrate, said first and third light transmission regions in said third plane region extending parallel to each other in a predetermined direction with said shield region therebetween.

6. A method of manufacturing a phase shift mask comprising the steps of:
   forming successively a semi-shield film for damping an intensity of exposure light, a phase shift film for changing a phase of the exposure light and a shield film for interrupting the exposure light on a main surface of a substrate having first, second, third and fourth light transmission regions and a shield region;
   removing successively said shield film and said phase shift film from said first, second and third light transmission regions to expose the surface of said semi-shield film;
   removing said semi-shield film from said third light transmission regions to expose the main surface of said substrate;

forming a trench at the main surface of said substrate at said third light transmission region;

removing said semi-shield film from said first light transmission region to expose the main surface of said substrate; and removing said shield film from said fourth light transmission region to expose the surface of said phase shift film.

7. A method of forming a pattern by effecting exposure on a predetermined region of photoresist applied to a wafer with a phase shift mask, said phase shift mask comprising:

a substrate having first, second, third and fourth light transmission regions allowing transmission of exposure light therethrough as well as a shield region interrupting the exposure light, and provided at its main surface in said third light transmission region with a trench such that a phase of the exposure light transmitted through said third light transmission region is different from that of the exposure light transmitted through said first and second light transmission regions;

a semi-shield film formed on the main surface of said substrate to cover said second and fourth light transmission regions and expose said first and third light transmission regions for damping the intensity of the exposure light;

a phase shift film formed on the main surface of said substrate to cover said fourth light transmission region and expose said first, second and third light transmission regions for setting the phase of the exposure light transmitted through said fourth light transmission region to be different from the phase of the exposure light transmitted through said first and second light transmission region and to be substantially equal to that of the exposure light transmitted through said third light transmission region; and a shield film formed on the main surface of said substrate to cover said shield region and expose said first, second, third and fourth light transmission regions, wherein said photoresist is of a positive type, and hole patterns are formed at a region on the surface of said photoresist irradiated with the exposure light through said first and third light transmission regions at said phase shift mask by development of said photoresist.

* * * * *